United States Patent [19]
Ishibashi et al.

[11] Patent Number: 5,740,115
[45] Date of Patent: Apr. 14, 1998

[54] SEMICONDUCTOR MEMORY DEVICE

[75] Inventors: Koichiro Ishibashi, Kodaira; Kunihiro Komiyaji; Kiyotsugu Ueda, both of Hachioji; Hiroshi Toyoshima, Hino, all of Japan

[73] Assignees: Hitachi, Ltd.; Hitachi ULSI Engineering Corporation, both of Tokyo, Japan

[21] Appl. No.: 498,969

[22] Filed: Jul. 6, 1995

[30] Foreign Application Priority Data

Jul. 8, 1994 [JP] Japan .................................. 6-156927
Sep. 9, 1994 [JP] Japan .................................. 6-215587

[51] Int. Cl.$^6$ ...................................................... G11C 7/00
[52] U.S. Cl. ...................................... 365/203; 365/233
[58] Field of Search .................................. 365/233, 203, 365/207, 208; 327/258, 255, 235, 271

[56] References Cited

U.S. PATENT DOCUMENTS 4,807,190  2/1989  Ishii .......................................... 365/203
5,400,282  3/1995  Suzuki ...................................... 365/233

FOREIGN PATENT DOCUMENTS 57-150190  9/1982  Japan .
5-120114   5/1993  Japan .

OTHER PUBLICATIONS

Y. Unekawa et al, "A 110MHz/1MBIT Synchronous Tag Ram", Symposium on VLSI Circuits, 1993, pp. 15–16.
K. Nakamura et al, "A 220MHz Pipelined 16Mb BiCMOS SRAM with PLL Proportional Self-Timing Generator", IEEE International Solid-State Circuits Conference-Digest Of Technical Papers, 1994, pp. 258–259.

J.G. Maneatis et al, "Precise Delay Generation Using Coupled Oscillators", IEEE Internatioanl Solid–State Circuits Conference –Digest Of Technical Papers, 1993, pp. 118–119.

Halkias et al, "Integrated Electronics: Analog and Digital Circuits and Systems", 1972, p. 488.

*Primary Examiner*—A. Zarabian
*Attorney, Agent, or Firm*—Fay, Sharpe, Beall, Fagan, Minnich & McKee

[57] ABSTRACT

A semiconductor memory device is provided which is able to supply data at high speed to a microprocessor (MPU) without being affected by the dispersion of power supply voltage, temperature and production process conditions. A semiconductor chip includes an address buffer, a decoder, a word driver, data lines, a sense amplifier, a main amplifier, an output buffer, and a PLL to which an external clock is applied. The PLL generates controls signals $\Phi_1$ through $\Phi_7$ with their phases shifted in turn, and supplies them to those internal circuits ranging from the address buffer to the output buffer. The PLL can control the phases of these control signals to be constant without being affected by the variations of temperature and power supply voltage. Thus, the internal circuits are precharged or equalized by the control signals, and then operated by the control signals to amplify data signal in turn. Therefore, the operating cycle time can be shortened as compared with the access time, and the access time can be kept constant.

15 Claims, 15 Drawing Sheets $$t_1 = \frac{C}{2I} V_{cc}$$

$$t_2 = \frac{C}{2I}(V_{cc} - 2V_{th})$$

PHASE AT EACH STAGE

● LEADING EDGE
○ TRAILING EDGE

SEMICONDUCTOR MEMORY DEVICE

BACKGROUND OF THE INVENTION

The present invention relates to semiconductor memory devices, and particularly to a semiconductor memory device suitable for a synchronous memory which synchronizes with an external clock signal. In addition, the present invention relates to a phase locked loop (PLL) for use in the semiconductor memory device or the like.

Recently, the frequency of a microprocessor (MPU) clock has increased for faster operation. A shorter cycle time for a cache memory that directly supplies data to the MPU has also been required, along with the fast operation of the MPU. In an asynchronous memory which is started to write/read data when supplied with address input, the conventional design has sought to reduce the access time to adapt to the increase of the clock frequency. However, the memory device generally has a large variation in access time due to the unevenness of power supply voltage, temperature and production process. Therefore, the conventional asynchronous memory device has needed to determine the clock period under the condition of the longest access time. This has prevented the MPU clock period from being short. Thus, as a fast memory device, the synchronous memory device which operates in synchronism with the clock MPU has lately attracted considerable attention.

As an example of means for fast operation of asynchronous memory, there is known a method for high-speed transfer of successive data by parallel reading of data to a plurality of input/output (I/O) lines, which is disclosed in JP-A-57-150190. In this memory device, at least part of successive data is outputted at a time, temporarily stored in a certain buffer region and then successively fast read from the buffer region.

A synchronous memory device is disclosed in JP-A-5-120114. This memory device has no PLL and is constructed to generate an internal common clock signal in synchronism with an external clock and supply it to the internal circuits for row address, column address and data output, thus actuating them to operate.

A synchronous memory device with PLL is also known in which the internal clock from the incorporated PLL is supplied to the address buffer and output buffer as shown in FIG. 2A. Referring to FIG. 2A, there is shown a semiconductor memory chip 1 which includes a PLL 2. The PLL 2 generates an internal clock $\Phi_0$ in synchronism with the external clock. The internal clock $\Phi_0$ from the PLL 2 is supplied to an address buffer 3 and an output buffer 9. When the internal clock $\Phi_0$ is supplied to these buffers from the PLL 2, an address signal to the address buffer 3 is processed by the address buffer 3, a decoder 4, a word driver 5, data lines 6, a sense amplifier 7, a main amplifier 8 and the output buffer 9 in turn. The output buffer 9 supplies data to an external terminal (not shown) at the internal clock $\Phi_0$ from the PLL2. According to the semiconductor memory chip 1 of the synchronous type shown in FIG. 2A, since the data output is controlled by the clock signal, the time taken from the application of the clock to the data output can be made more constant, despite variations that might otherwise occur due to the unevenness of power supply voltage, temperature and production process. This synchronous memory device with PLL is described in, for example, Symposium on VLSI Circuits, 1993, pp. 15–16.

The above PLL is used for synchronizing the clock signal within a semiconductor IC with the external clock signal. The known structures are one type using a single ring oscillator for the oscillation circuit and the other type using an array of ring oscillators.

An example of the oscillation circuit using a ring oscillator is described as an MST (multi-stage-tapped) in "A 220 MHz Pipelined 16 Mb BICMOS SRAM with PLL Proportional Self-Timing Generator", IEEE International Solid-State Circuit Conference Digest of Technical Papers, 1994, pp. 258–259. In this example, the ring oscillator is formed of a row of inverters. Signals are led out of the respective output terminals of the inverters and used to produce clock signals of desired phases.

An example of the array-type oscillator is proposed in "Precise Delay Generation Using Coupled Oscillators", IEEE International Solid-State Circuits Conference Digest of Technical Papers, 1993, pp. 118–119. In this example, differential amplifiers are connected in an array to constitute oscillation circuits from which clocks of desired phases can be generated with high precision.

However, the conventional asynchronous memory device of the fast transfer type for successive data which uses the method of parallel reading of data onto a plurality of input/output lines, or (I/O lines) has the problem that a plurality of input/output lines and main amplifiers are necessary for producing data in parallel, thus incurring the increase of chip area.

In addition, the conventional synchronous memory device without PLL in which the signals in the internal circuits are processed in accordance with the internal common clock signal synchronized with the external clock takes a time of one cycle to transmit a signal through each of the address buffer, decoder, word driver and so on in turn. In this case, the total time taken is seven cycles of clock signal for the input signal to be transmitted from the address buffer to the output buffer. This is the limit.

Moreover, in the synchronous memory device with PLL mentioned above, the time necessary for a data signal to reach the output buffer 9 from when the address signal is inputted at the clock signal $\Phi_0$ is relatively longer than that taken for the data arrived at the output buffer 9 to be outputted therefrom at the clock $\Phi_0$. Therefore, the process time necessary for data signal to reach the output buffer 9 from when the address signal is inputted at the clock signal $\Phi_0$ is much varied by the unevenness of production process, ambient temperature and power supply voltage. Thus, the clock signal cycle time $t_{cycle}$ is limited as described below.

As, for example, illustrated by the flow of signal in FIG. 2B, it is assumed that the above signal-process time is varied between a minimum time $t_{a(min)}$ and a maximum time $t_{a(max)}$ due to the unevenness of temperature and power supply voltage. In addition, it is assumed that under certain worst conditions of temperature and power supply voltage, after an address signal is inputted at a clock ① and then at the next clock ②, corresponding data arrives latest at the output buffer as indicated by dotted curves b, respectively. In this case, the data arrived at the output buffer after the address is inputted at the clock ① must be discriminated from others by using a judgement time shorter than the maximum time $t_{a(max)}$. Since the temperature and power supply voltage are changed by the external situations, corresponding data may arrive fastest as indicated by solid curves a. Thus, in this case, the above judgement time for the data corresponding to the address input at the clock ① coincides with the time for the data corresponding to the address input at the clock ②, or may be decided as the data corresponding to the address input at the clock ②. Consequently, when the latest curve b of data flow corresponding to the address input at the clock ① intersects the fastest curve a of data flow corresponding to the address input at the clock ②, data corresponding to address signals inputted at both time points cannot be discriminated from each other.

In other words, in order to distinguish between data corresponding to input address signals, the above intersection must be prevented from occurring. Thus, the cycle time $t_{cycle}$ of clock signal is required to meet the following condition.

$$t_{cycle} > t_{a(max)} - t_{a(min)} \quad (1)$$

That is, the cycle time $t_{cycle}$ of the clock signal cannot be made shorter than the difference between the maximum and minimum values of the dispersion or unevenness of the time taken for the data signal to arrive at the output buffer 9 after the address signal is inputted at clock signal $\Phi_0$, or $(t_{a(max)} - t_{a(min)})$. For this reason, the synchronous memory device shown in FIG. 2A has a limit in the reduction of the cycle time $t_{cycle}$ as indicated by the condition (1). Although the signal-process time is distributed due to the variation of power supply voltage and ambient temperature as described above, it is similarly dispersed when the chip used is one of the chips produced under scattered conditions, not under an equal condition.

In the synchronous memory with PLL in which the known ring oscillator is used, since the ring oscillator has m inverters connected in a ring shape, clock signals of different phases can be produced from the connection points between a plurality of inverters. However, if many signals of different phases are required, a large number of inverters must be connected, and hence the oscillation frequency of each clock signal is reduced. If the number of inverters is contrarily decreased for higher-frequency oscillation, signals of arbitrary phases cannot be produced. Therefore, the synchronous memory device with this PLL has a limited speed.

The conventional array-type oscillation circuit can generate precise clock signals of desired phases and of a higher frequency than the ring-type oscillation circuit. However, when the array-type oscillator is formed by currently available differential amplifiers, the consumption current is increased due to the steady current flowing in the differential amplifiers. This problem becomes serious, or the consumption current in all the oscillation circuit is increased, particularly when the number of differential amplifiers connected in an array is increased. Accordingly, when this PLL is used in the synchronous memory device, the consumption power is increased.

SUMMARY OF THE INVENTION

The present invention intends to provide a semiconductor integrated circuit which has overcome the technical difficulties in the prior art.

It is an object of the invention to provide a semiconductor memory device which can be used as a cache memory capable of fast supplying data to MPU during a small number of cycles of clock signal by solving the problems in the prior art and reducing the clock time interval.

It is another object of the invention to provide a PLL circuit suitable for use in a synchronous memory with PLL.

It is still another object of the invention to provide a clock circuit which consumes little power, uses high-speed differential amplifiers suitable for an array-type oscillation circuit, and which is capable of generating precise clock signals of desired phases without being affected by variations of power supply voltage, conditions of process, temperature and so on.

The other objects, features and advantages of the invention will be apparent from the specification or drawings of this application.

In order to achieve the above objects, according to one aspect of the invention, there is provided a semiconductor memory device which includes at least the address buffer 3 for receiving and latching an address signal, the decoder 4 for decoding the address signal from the address buffer 3, the word driver 5 for amplifying the output from the decoder and driving a word line, the data lines 6 for taking out a signal from a memory cell selected by the word line, the sense amplifier 7 for detecting the signal on the data line 6, the main amplifier 8 for amplifying the signal detected by the sense amplifier 7, and the output buffer 9 for supplying the signal amplified by the main amplifier 8 to the outside as data, and which is of the synchronous type for receiving the address and producing the data in synchronism with a clock signal fed from the outside. The semiconductor memory device further includes a control circuit which has a control signal generator, or PLL 20, incorporated for generating a plurality of control signals $\Phi_1$ through $\Phi_7$ of different phases in synchronism with the above clock signal from the outside. The plurality of control signals $\Phi_1$ through $\Phi_7$ are respectively fed to at least the address buffer 3, decoder 4, word driver 5, data lines 6, sense amplifier 7, main amplifier 8 and output buffer 9, in the order of fast phase, which are arranged along the signal flow, so that the address buffer 3 and decoder 4 are precharged. The data lines 6, sense amplifier 7, main amplifier 8 and output buffer 9 are equalized, by the corresponding control signals during a certain time $t_{pre}$. Further, the respective circuits of the address buffer 3 to which the address signal is applied, through the output buffer 9 from which the data corresponding to the address signal is supplied to the outside are operated in turn for a necessary time $t_{ope}$ after lapse of the certain time $t_{pre}$.

In the above semiconductor memory device, as shown in FIG. 8, it is preferred that the control signals $\Phi_2$ and $\Phi_3$ generated from a control signal generator, or a PLL 80, be respectively supplied to a row-line predecoder 82, a column-line predecoder 83, and, a decoder constituted by a row decoder 84 and a column decoder 86, which constitute the above-mentioned decoder.

The above control signal generator may be a DLL (delay locked loop).

In addition, according to another aspect of the invention, there is provided a semiconductor memory device including a decoding circuit which has, as shown in an example of FIG. 6, a first MOS transistor of a first conductivity type (for example, a MOS transistor 61 of N-type) to which a precharge signal $\Phi_{pre}$ is applied at its gate, a second MOS transistor of the first conductivity type (for example, a MOS transistor 62 of N type) of which the drain is connected to the source of the first MOS transistor, and a third MOS transistor of the first conductivity type (for example MOS transistor 63 of N type) of which the drain is connected to the source of the second MOS transistor, so that the source of the first MOS transistor 61 is precharged by the precharge signal $\Phi_{pre}$, wherein decoding is made according to an address signal fed to the gates of the second and third MOS transistors 62, 63.

Moreover, as shown in an embodiment of FIG. 9, either one of the above-given semiconductor memory devices, such as a cache memory 92, can be connected to a microprocessor 91 by an address bus 93 and a data bus 94, thereby constituting a computer system in which the semiconductor memory device 92 can supply data to the microprocessor 91 while a common system clock 95 is being fed to the memory device and the microprocessor.

Furthermore, according to the invention, the PLL circuit of the synchronous memory device is so constructed that optimum clock signals are first generated from a plurality of differential amplifiers of an array-type oscillator, and precise clock signals of desired phases are generated from these optimum clock signals. Thus there is almost no effect of the variations of power supply voltage, process conditions, temperature and so on. Also, an array-type oscillator for PLL is constructed by using differential amplifiers each of which has pMOSFETs cross-coupled for positive feedback amplification.

The general operation of the invention will be described with reference to the accompanying drawings.

FIGS. 1A and 1B, respectively, are conceptual diagram of the chip of a semiconductor memory device of the invention, and a diagram showing signal flow. As illustrated in FIG. 1A, an external clock is applied to the PLL 20. The PLL 20 sequentially generates control signal pulses $\Phi_1$ through $\Phi_7$ which have their phases shifted up little by little in turn. These control signal pulses $\Phi_1$ through $\Phi_7$ respectively precharge the address buffer 3, decoder 4 and word driver 5, each of which has a single Signal line, for a constant time $t_{pre}$ as shown in FIG. 1B. The control signal pulses also equalize the memory cell 6, sense amplifier 7, main amplifier 8 and output buffer 9, each of which has a pair of signal lines, for a constant time $t_{pre}$. Then, the precharging or equalizing operation is stopped when the signal in the previous stage arrives at each circuit, and the operation of the corresponding circuit is performed for a constant time $t_{ope}$. The address signal is first transmitted from the address buffer 3 through the decoder 4 to the word driver 5, and the memory cell connected to the data lines 6 is selected. The data signal produced on the data lines 6 from the memory cell is amplified by the sense amplifier 7 and main amplifier 8, and supplied through the output buffer 9. In this operation, the minimum value of the cycle time $t_{cycle}$ of the clock signal is given by the following equation.

$$t_{cycle} = t_{pre} + t_{ope} \qquad (2)$$

Therefore, since the cycle time $t_{cycle}$ can be shortened by decreasing $t_{pre}$ and $t_{ope}$, the cycle time is prevented from being increased by a variation of access time as in the conventional asynchronous type. Further, unlike the conventional synchronous type with PLL used at both input and output portions only, the cycle time according to the invention is not limited by the difference between the maximum and minimum values of the time taken for the address signal to arrive at the data output buffer 9 after being applied to the address buffer 3 in synchronism with the clock signal.

The semiconductor memory devices of the invention employ PLL for all control signal pulses. The PLL is able to generate control signal pulses of arbitrary phases in synchronism with the external clock. Thus, since the phase of each control signal pulse can be controlled to be constant without being affected by variations of temperature and power supply voltage, it is possible to generate at predetermined time points the control signal pulses which are used for the precharging/equalizing and signal processing necessary for the semiconductor memory devices of the invention. Therefore, the data signal after the application of the clock signal can be produced at a constant time without depending on the variations of temperature, power supply voltage and production process conditions. The word driver may be constructed by the type in which a control signal pulse is not supplied to it from the PLL as described later.

Moreover, the control signal pulses may be generated from the DLL which has delay circuits provided to receive the external clock and to generate internal clocks from it.

In the PLL circuits in the embodiments of the invention, first, a plurality of differential amplifiers constituting an array-type oscillator are used to generate optimum clock signals, from which precise clock signals of desired phases can be generated with almost no effect by the variations of power supply voltage, process conditions, temperature and so on. Second, differential amplifiers with pMOSFETs cross-coupled for positive feedback amplification are used to constitute an array-type oscillator in which, since the amplitudes of the input and output signals are increased, the stationary-state current can be removed and, as a result, the power consumption can be reduced. Consequently, high-precision, small-power-consumption synchronous memory devices can be produced by use of the PLL circuit of the invention.

DESCRIPTION OF THE PREFERRED EMBODIMENTS

Some preferred embodiments of the semiconductor memory device of the invention will be described in detail with reference to the accompanying drawings.

Figure 3:
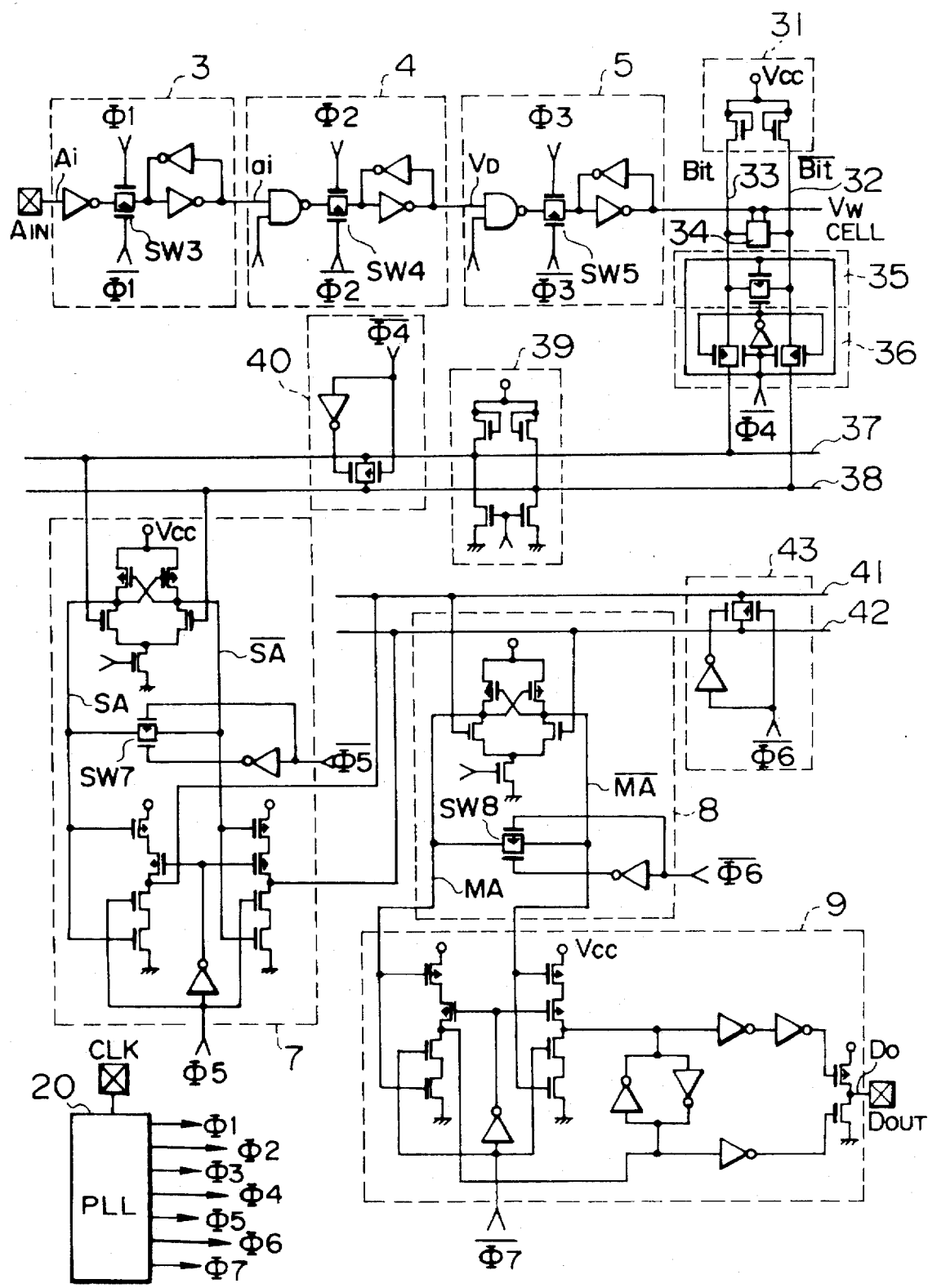
FIG. 3 is a circuit diagram of the whole arrangement of one embodiment of the semiconductor memory device of the invention.

FIG. 3 is a circuit diagram of the whole arrangement of one embodiment of the semiconductor memory device of the invention. Referring to FIG. 3, there are shown the address buffer 3, the decoder 4, the word driver 5, a load 31 on, bit lines 32, 33, a memory cell 34, an equalizing MOSFET circuit 35 on the bit lines, a column selector 36, common data lines 37, 38, a load 39 on the common data lines, an equalizing MOSFET circuit 40 on the common data lines, the sense amplifier-and-multiplexer 7, data bus 41, 42, an equalizing MOSFET circuit 43 on the data bus, the main amplifier 8, and the output buffer 9.

Figure 11A:
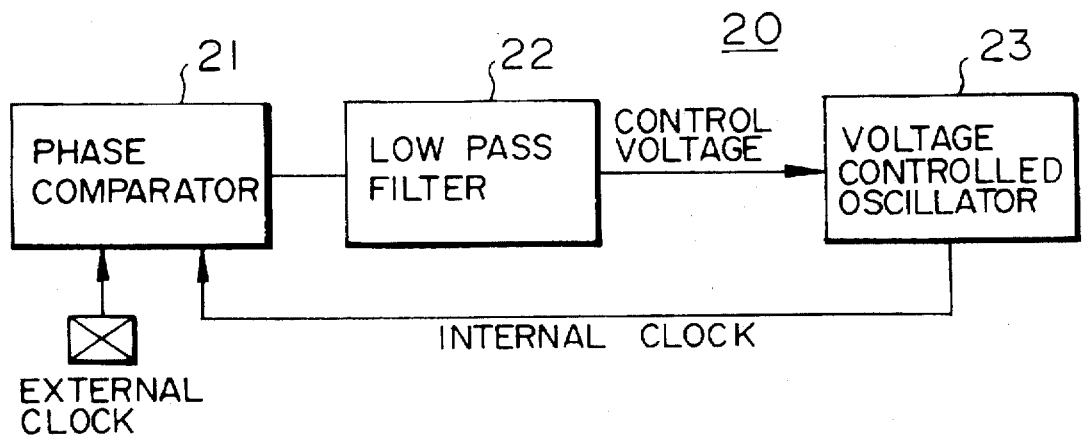
FIGS. 11A and 11B are a block diagram of a PLL showing the arrangement of the PLL used in a semiconductor memory device of the invention, and a circuit diagram of a voltage-controlled oscillator, respectively.
Figure 11B:
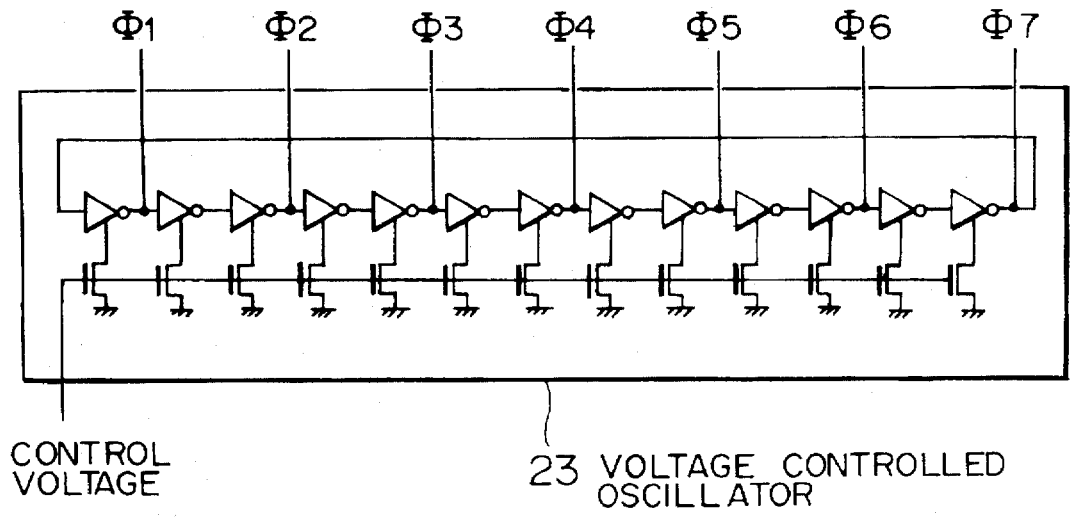

The control signal pulses $\Phi_1$ through $\Phi_7$ supplied to the address buffer 3, decoder 4, word driver 5, equalizing MOSFET circuit 35, sense amplifier 7, main amplifier 8 and output buffer 9 are generated from the PLL 20. The arrangement of the PLL 20 is shown in FIGS. 11A and 11B. FIG. 11A is a block diagram of the PLL 20. The PLL 20, as illustrated in FIG. 11A, includes a phase comparator 21 for comparing the phase of an external clock with that of an internal clock signal and producing an error signal therebetween, a low-pass filter 22 for integrating the error signal to thereby convert it into an error voltage, and a voltage-controlled oscillator 23 of which the oscillation frequency is controlled by a control voltage proportional to this error voltage. FIG. 11B is a circuit diagram of a specific arrangement of the voltage-controlled oscillator 23. As illustrated, the oscillator 23 includes a plurality of inverters, and a plurality of MOS transistors of which the gates are connected together and used to adjust the speed of each inverter. The voltage-controlled oscillator 23 generates signal pulses $\Phi_1$ through $\Phi_7$ which have their phases shifted little by little, or successively shifted by a value corresponding to two inverter stages for each pulse. These signal pulses may be supplied as control signal pulses to the circuits as shown in FIG. 3.

Figure 21A:
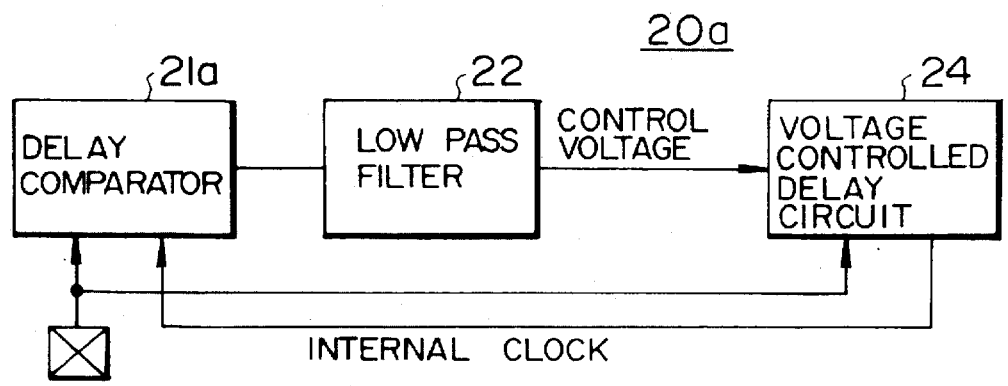
FIGS. 21A and 21B are a block diagram of a DLL showing the arrangement of the DLL used in a semiconductor memory device of the invention, and a circuit diagram of the voltage-controlled delay circuit, respectively.
Figure 21B:
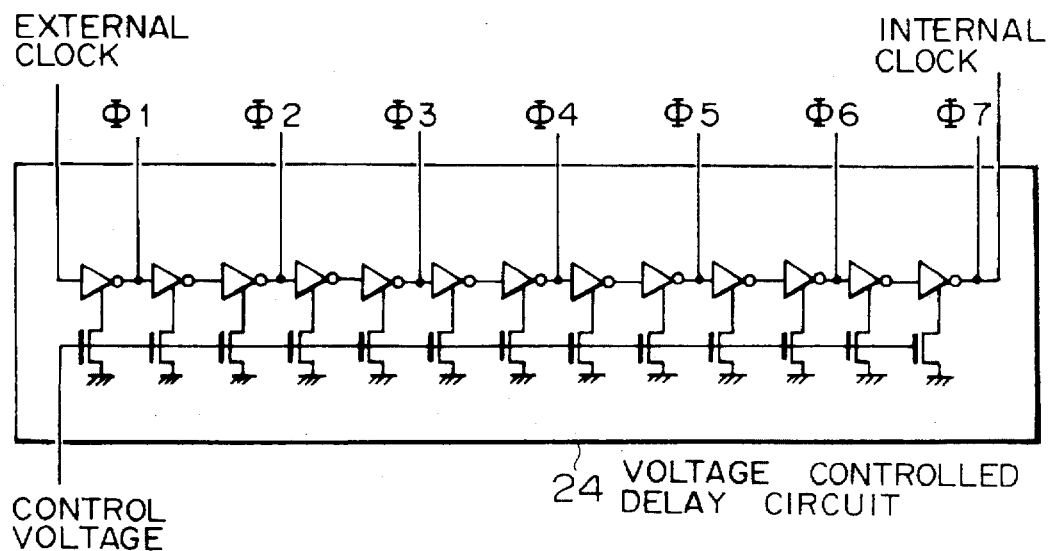

The PLL 20 may be replaced by a DLL 20a. FIG. 21A is a block diagram of the arrangement of the DLL 20a. The DLL 20a, as illustrated, includes a delay comparator 21a, the low-pass filter 22, and a voltage-controlled delay circuit 24. In the DLL 20a, the voltage-controlled delay circuit 24 delays the external clock to thereby generate the internal clock. FIG. 21B is a circuit diagram of a specific arrangement of the voltage-controlled delay circuit 24. As illustrated, the delay circuit 24 includes a plurality of inverters for receiving the external clock and amplifying it, and a plurality of MOS transistors of which the gates are connected together and used to adjust the speed of each inverter. The internal clock generated from the circuit 24 is fed to the delay comparator 21a by which it is compared with the external clock. The compared result is fed back to the control voltage through the low-pass filter 22 so that the phase of the external clock can be coincident with that of the internal clock. The voltage-controlled delay circuit 24 can generate the signal pulses $\Phi_1$ through $\Phi_7$ of which the phases are shifted little by little in turn, or shifted by a value corresponding to two inverter stages for each pulse. These pulses can be supplied as control signal pulses to the circuits as shown in FIG. 3.

Figure 4:
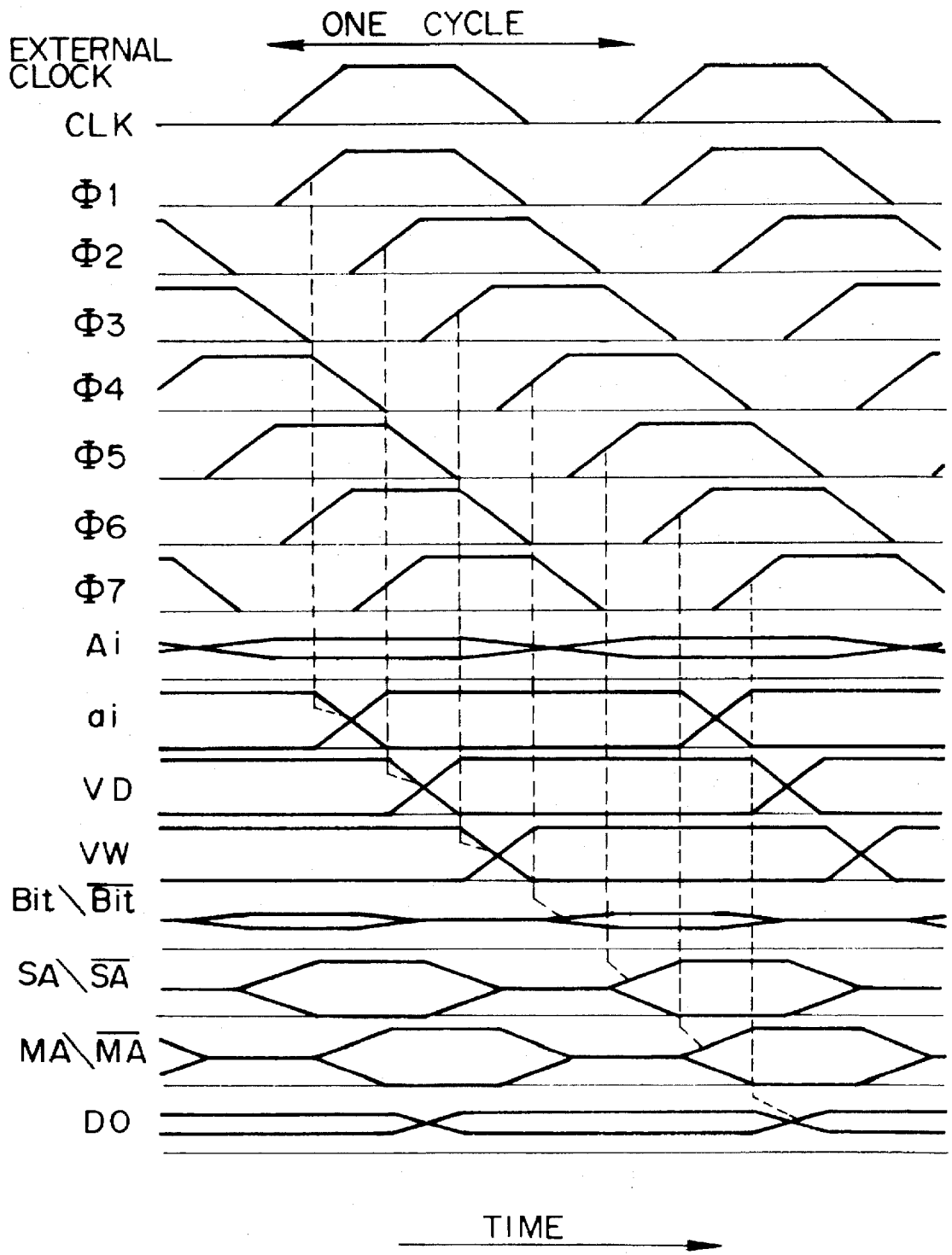
FIG. 4 is an operating waveform diagram showing the operation of the semiconductor memory device shown in FIG. 3.

FIG. 4 is a waveform diagram to which reference is made in explaining the operation of the semiconductor memory device of this embodiment. The operation of this memory device will be described with reference to FIGS. 3 and 4.

An address signal $A_i$ is applied via an address input terminal $A_{IN}$ to the address buffer 3. The control signal pulse $\Phi_1$ is also fed to the address buffer 3. When this control signal pulse $\Phi_1$ is at a positive edge, a bus transistor/switch $SW_3$ formed of p-channel and n-channel MOSFETs is turned on so that the input address signal $A_i$ is latched by a latch circuit which is formed of two inverters. The latch circuit produces an internal address signal $a_i$. These operations mentioned so far are the same as those of the conventional synchronous semiconductor memory device. In FIG. 3, the p-channel MOSFET and the n-channel MOSFET are distinguished in the usual way. In addition, while the transistors used are MOSFETs which are generally used in the semiconductor integrated circuit, they may be replaced by other field-effect transistors (such as MISFETs) or bipolar transistors.

Then, the internal address signal $a_i$ is fed to a NAND circuit of the decoder 4 so that the decoder 4 produces a decoded signal $V_D$. When the control signal pulse $\Phi_2$ is at a positive edge, a switch $SW_4$ is turned on so that the decoded signal $V_D$ is latched by a latch circuit and produced therefrom.

Figure 20:
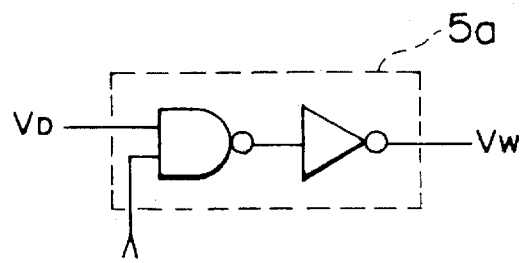
FIG. 20 is a circuit diagram of another example of the word driver which can be used in the semiconductor memory device shown in FIG. 15.

The decoded signal $V_D$ is further supplied to a NAND circuit of the word driver 5 and thereby decoded so that a word line voltage $V_W$ is produced from the word driver 5. When the control signal $\Phi_3$ is at a positive edge, a switch $SW_5$ is turned on so that the word line voltage $V_W$ is latched by a latch circuit and produced therefrom. Although the word driver may be constructed to drive in response to the control signal pulse $\Phi_3$ as described above, the number of drivers used is sometimes very large because it equals the number of word lines used. In this case, the load capacity on the control signal pulse $\Phi_3$ becomes large and hence the consumption current necessary for driving the control signal pulse $\Phi_3$ is much increased. Thus, in order to make the control signal pulse $\Phi_3$ unnecessary, the word driver 5 may be replaced by an asynchronous word driver 5a which does not need to be precharged and which is formed by a series circuit of a NAND and an inverter as shown in FIG. 20. If the conventional type is used for only the word driver as above, the proportion of the transmission time in the word driver to all the transmission time is small, there is almost no dispersion of power supply voltage, temperature and so on.

Then, before the word line voltage $V_W$ is made in the "H" (high)-state, the control signal pulse $\overline{\Phi}_4$ becomes "L" (low), and thus the equalizing MOSFET circuit 35 is turned on to equalize the pair of bit lines Bit 33 and $\overline{\text{Bit}}$ 32. Thereafter, the control signal pulse $\overline{\Phi}_4$ is turned "H" and instantly the equalizing stops, so that the signal in the memory cell 34 is produced on the pair of bit lines 32, 33. When the equalizing MOSFET circuit 40 is turned on by the control signal pulse $\overline{\Phi}_4$, the common data lines 37, 38 are also equalized. When the control signal pulse $\overline{\Phi}_4$ is turned "H", the equalizing MOSFET circuit 40 is turned off to stop equalizing, and the signal on the pair of bit lines 32, 33 is transmitted to the sense amplifier 7.

In the sense amplifier 7, when the control signal pulse $\overline{\Phi}_5$ is turned "L", a switch $SW_7$ of the sense amplifier 7 is turned on, and the output voltages $S_A$, $\overline{S}_A$ are equalized. Then, the control signal pulse $\overline{\Phi}_5$ is turned "H" and instantly the switch $SW_7$ is turned off to stop equalizing, so that the amplified output voltages $S_A$, $\overline{S}_A$ are fed from the sense amplifier 7 to the data bus 41, 42.

In the main amplifier 8, when the control signal pulse $\overline{\Phi}_6$ is first turned "L", a switch $SW_8$ is turned on so that the output voltages $M_A$, $\overline{M}_A$ are equalized. When the control signal pulse $\overline{\Phi}_6$ is turned "H", the switch $SW_8$ is instantly turned off to stop equalizing, and the output voltages $M_A$, $\overline{M}_A$ are supplied from the main amplifier 8 to the output buffer 9. The output buffer 9 latches the output voltages in response to the control signal pulse $\overline{\Phi}_7$, and produces a data signal $D_0$ at an external terminal $D_{OUT}$.

Figure 1A:
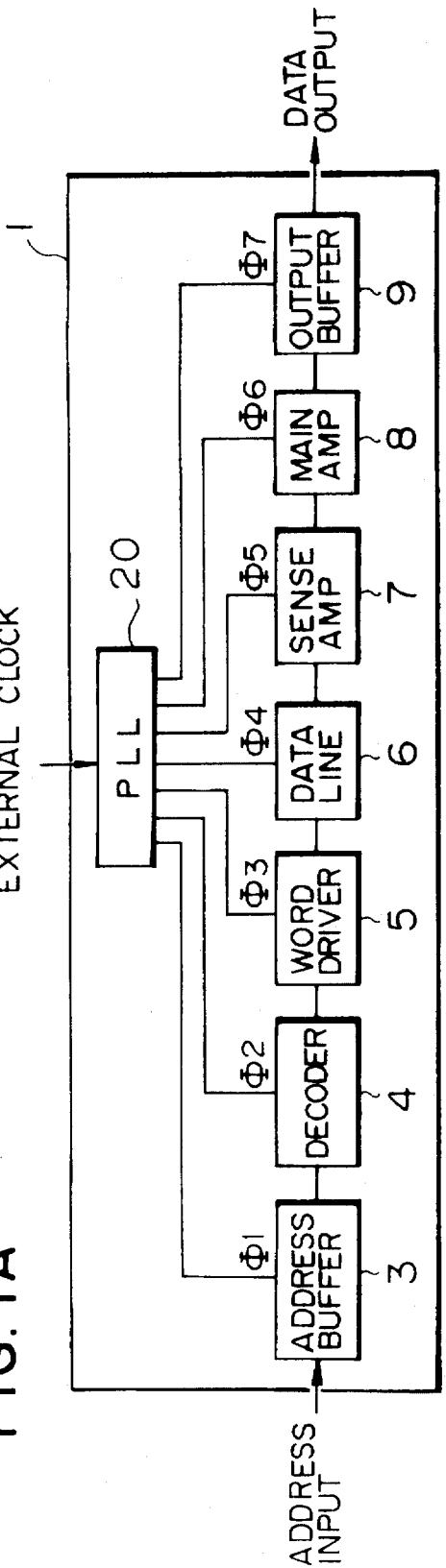
FIGS. 1A and 1B are a conceptual diagram for the explanation of a semiconductor memory device with PLL according to this invention, and a diagram of signal flow, respectively.
Figure 1B:
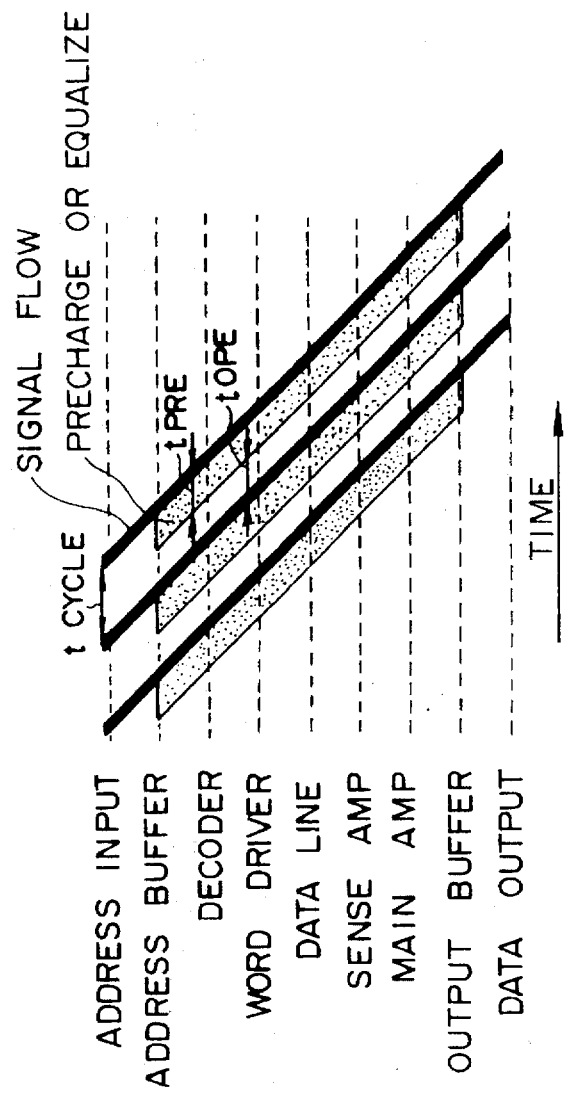

In this embodiment, as described above, in the path of the address buffer 3, decoder 4, word driver 5, bit lines 32, 33, common data lines 37, 38, sense amplifier 7, main amplifier 8 and output buffer 9 through which the signal is transmitted and amplified, transmission of signals to latch circuits and precharging or equalizing are performed. Then, signals are amplified under the control signal pulses $\Phi_1$ through $\Phi_7$ with their phases shifted little by little in turn which are generated from the PLL 20 in synchronism with the clock signal CLK from the outside, as will be understood from the operating waveform diagram of FIG. 4. Therefore, as shown in FIG. 1, the cycle time $t_{cycle}$ can be reduced to the sum of the equalizing time $t_{pre}$ and the signal processing time $t_{ope}$.

Thus, in the conventional synchronous memory device without a PLL in which a common clock signal is supplied in synchronism with the external clock, a time corresponding to seven cycles of external clock is taken for the signal to be transmitted from the address buffer to the output buffer, whereas in this embodiment only a time corresponding to about two cycles thereof is taken as shown in FIG. 4, and thus fast operation is possible.

Moreover, since the control signal pulses from the PLL 20 do not depend on the variations of power supply voltage, temperature and production process conditions, the signal transmission is also not affected by these variations so that the time from the address signal input to the data output can be kept constant.

In addition, while the control signal pulses are generated from a PLL in this embodiment, they may be generated from a DLL which does not depend on the variations of power supply voltage, temperature and production process conditions as described above.

Figure 7:
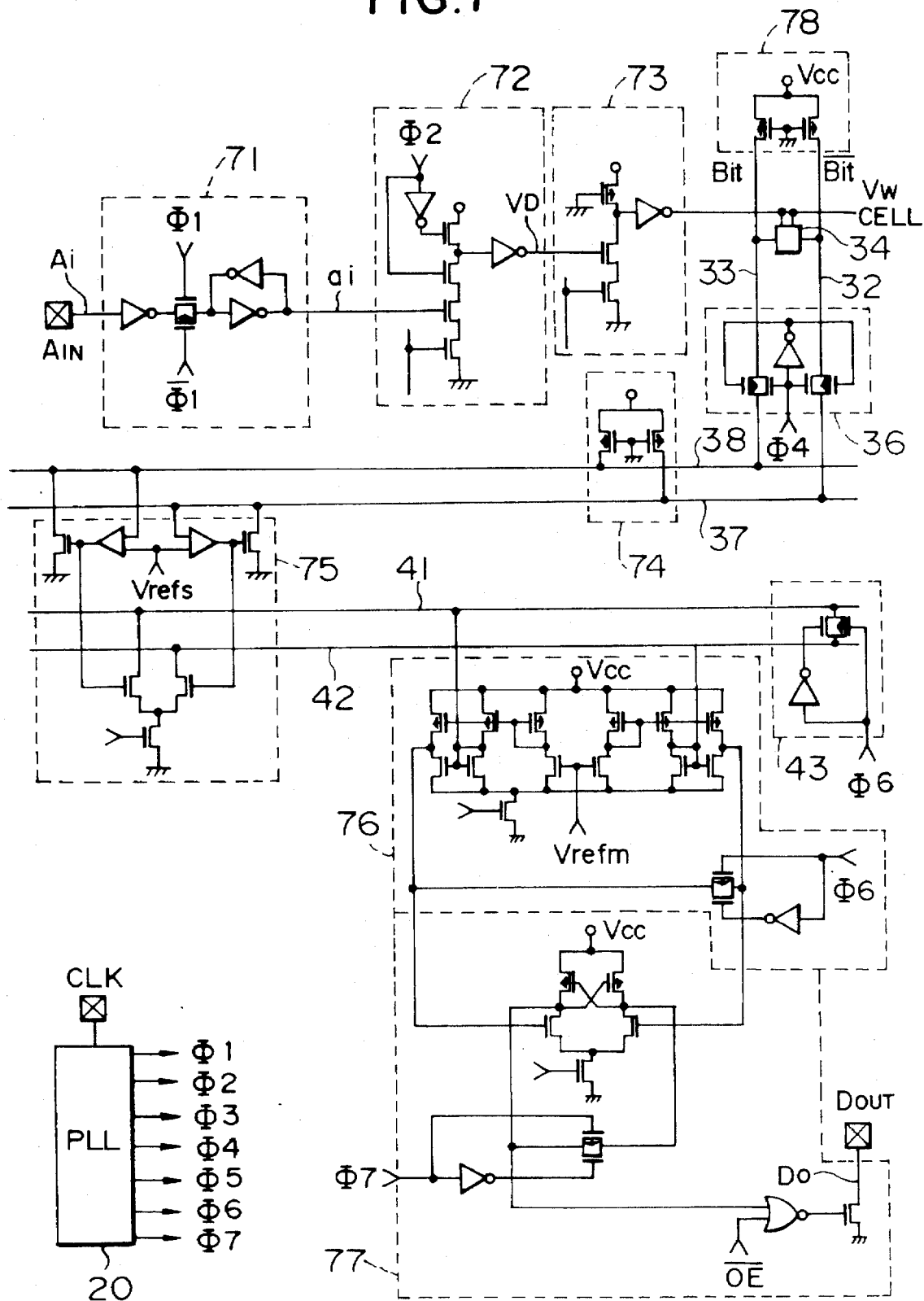
FIG. 7 is a circuit diagram of the whole arrangement of another embodiment of the semiconductor memory device of the invention.

FIG. 7 is a circuit diagram of the whole arrangement of another embodiment of the semiconductor memory device of the invention. Referring to FIG. 7, there are shown an address buffer 71, a decoder 72, a word driver 73, a load 78 on bit lines 32, 33, the memory cell 34, the column selector 36, common data lines 37, 38, a load 74 on common data lines, the equalizing MOSFET circuit 40 for common data lines, a sense amplifier/multiplexer 75, the data buses 41, 42, the equalizing MOSFET 43 for data bus, a main amplifier 76, and an output buffer 77.

The control signal pulses $\Phi_1$ through $\Phi_7$ fed to the address buffer 3, decoder 72, sense amplifier 75, main amplifier 76 and output buffer 77 are generated from the PLL 20, as in the previous embodiment. In this embodiment, however, the word driver 73 is of the conventional structure including a NAND circuit and an inverter in which the control signal pulse $\Phi_3$ is not used because of a large load capacity. In FIG. 7, $V_{refs}$ is the reference voltage to the sense amplifier 74, $V_{refm}$ is the reference voltage to the main amplifier 75, and $\overline{OE}$ is the output enable signal.

In addition, the decoder 72 in this embodiment uses a new dynamic decoder circuit capable of faster decoding than the conventional one. The dynamic decoder circuit according to this invention will be described as compared with the conventional one.

Figure 5A:
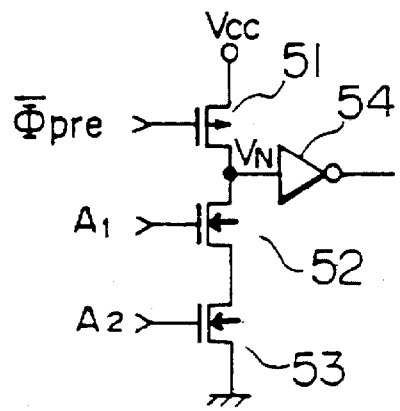
FIGS. 5A and 5B are a fundamental circuit diagram for explaining the conventional dynamic decoder, and an operating waveform diagram, respectively.
Figure 5B:
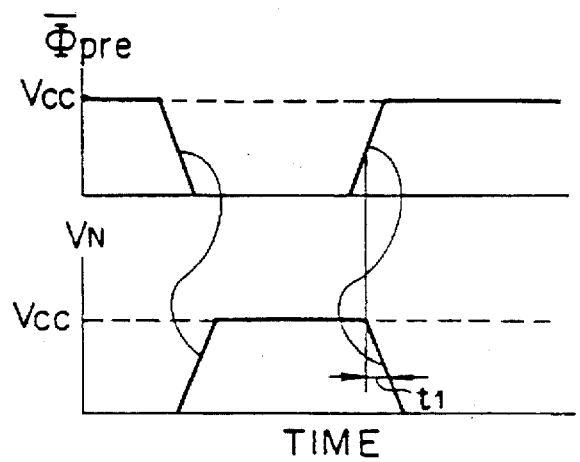

FIGS. 5A and 5B are diagrams concerning the conventional dynamic decoder circuit. FIG. 5A shows its fundamental arrangement. This dynamic decoder circuit has a series circuit of a PMOS transistor 51 and NMOS transistors 52, 53, and an inverter 54. The input end of the inverter 54 is connected to the junction $V_N$ between the PMOS transistor 51 and the NMOS transistor 52. FIG. 5B is an operating waveform diagram of the conventional dynamic decoder circuit of this arrangement. The connection point $V_N$ is precharged by the signal $\overline{\Phi}_{pre}$ through the PMOS transistor 51 and thus charged up to a power supply voltage $V_{cc}$. Then, when the signal $\overline{\Phi}_{pre}$ is inverted, decoding is made according to the address signals $A_1$ and $A_2$. When the address signals $A_1$ and $A_2$ are both "H", this circuit is selected, and the voltage at the junction $V_N$ is discharged from voltage $V_{cc}$ to ground GND. At this time, if the current flowing in the NMOS transistors 52, 53 and the capacitance at the junction $V_N$ are respectively represented by I and C, the time $t_1$ required for the voltage at the junction $V_N$ to be discharged to ½ the power supply voltage $V_{cc}$ can be given by the following equation.

$$t_1 = (C/2\ I) \cdot V_{cc} \qquad (3)$$

Figure 6A:
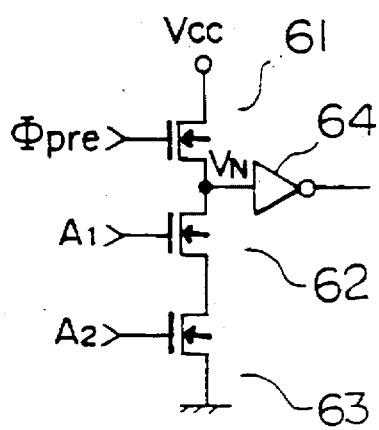
FIGS. 6A and 6B are a fundamental circuit diagram useful for explaining the dynamic decoder of the invention, and an operating waveform diagram, respectively.
Figure 6B:
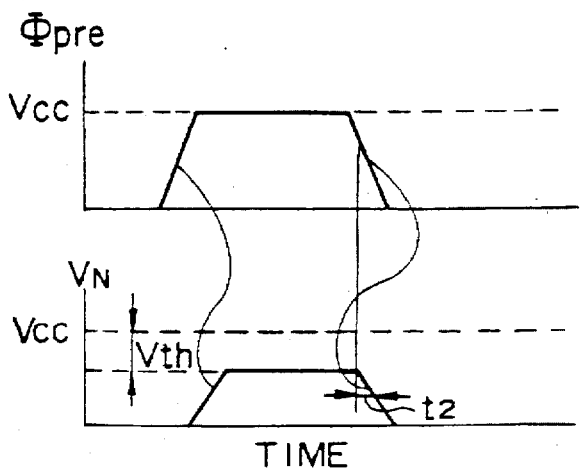

The dynamic decoder circuit according to this invention, as shown in FIG. 6A, has a series circuit of NMOS transistors 61, 62, 63 and an inverter 64. FIG. 6B is an operating waveform diagram of the dynamic decoder circuit of this arrangement according to this invention. The junction $V_N$ is precharged by the signal $\Phi_{pre}$ through the NMOS transistor 61. Since this precharging transistor is an N-type MOS transistor, the voltage at the junction $V_N$ is charged only up to $V_{cc} - V_{th}$ where $V_{th}$ is the threshold voltage of the NMOS transistor 61. Then, when the signal $\Phi_{pre}$ is inverted, decoding is made according to the address signals $A_1$ and $A_2$. When the address signals $A_1$ and $A_2$ are both "H", this circuit is selected, and the voltage at the junction $V_N$ is discharged from $V_{cc} - V_{th}$ to GND. At this time, if the current flowing in the NMOS transistors 62, 63 and the capacitance at the junction $V_N$ are respectively represented by I and C, the time $t_2$ taken for the junction $V_N$ to be discharged up to ½ the power supply voltage $V_{cc}$ is expressed by the following equation.

$$t_2 = (C/2\ I) \cdot (V_{cc} - 2V_{th}) \qquad (4)$$

Thus, from the comparison between the equations (4) and (3), it will be understood that the time $t_2$ taken for the junction $V_N$ to be discharged up to ½ the power supply voltage $V_{cc}$ is $C \cdot V_{th}/I$ shorter than the time $t_1$ in the conventional arrangement shown in FIGS. 5A and 5B. In other words, the dynamic decoder circuit according to this invention can operate at higher speed than the conventional one shown in FIGS. 5A and 5B.

Therefore, the decoder 72 in the semiconductor memory device of this embodiment shown in FIG. 7 can decode at higher speed than the conventional one using the dynamic decoder circuit shown in FIGS. 5A and 5B since the decoder 72 in this embodiment is formed of the dynamic decoder circuit with the NMOS transistor used for precharging.

In this embodiment, as in the first embodiment, in the path of the address buffer 3, decoder 72, common data lines 37, 38, sense amplifier 75, main amplifier 76 and output buffer 77 through which the signal is transmitted and amplified, the transmission of signal to latches, precharging or equalizing are made by the control signal pulses $\Phi_1$ through $\Phi_7$ which are sequentially generated from the PLL 20. Thus, in this embodiment, too, the cycle time $t_{cycle}$ can be reduced to the sum of the equalizing time $t_{pre}$ and the signal processing time $t_{ope}$ as described with reference to FIG. 1.

Moreover, since the control signal pulses $\Phi_1$ through $\Phi_7$ generated from the PLL 20 are not dependent on the variations of power supply voltage, temperature and production process conditions, the signal transmission is not affected by these variations, and thus the time from the address signal input to the data output can be kept constant.

The semiconductor memory device of this embodiment, unlike the above embodiment, employs the current-sense type sense amplifier 75 for reducing the amplitude on the bit lines 32, 33 and common data lines 37, 38. In addition, the load 78 on the bit lines and the load 74 on the common data lines are formed of PMOS transistors for preventing the voltage at the information storage node within the memory cell 34 from being decreased because the potentials on the bit lines 32, 33 and common data lines 37, 38 are excessively reduced by the action of the current sense amplifier 75. Thus, the bit lines 32, 33 need not be equalized. Hence, the equalizing MOS 35 shown in FIG. 3 is not necessary. Even in such a case, the control signal pulses $\Phi_5$ through $\Phi_7$ whose phases are shifted little by little in turn are supplied from the PLL 20 to the data bus 41, 42, main amplifier 76 and output buffer 77, and thus they are not affected by the variations of power supply voltage, temperature and production process conditions, but can be kept constant. Therefore, the cycle time $t_{cycle}$ can be reduced.

Figure 8:
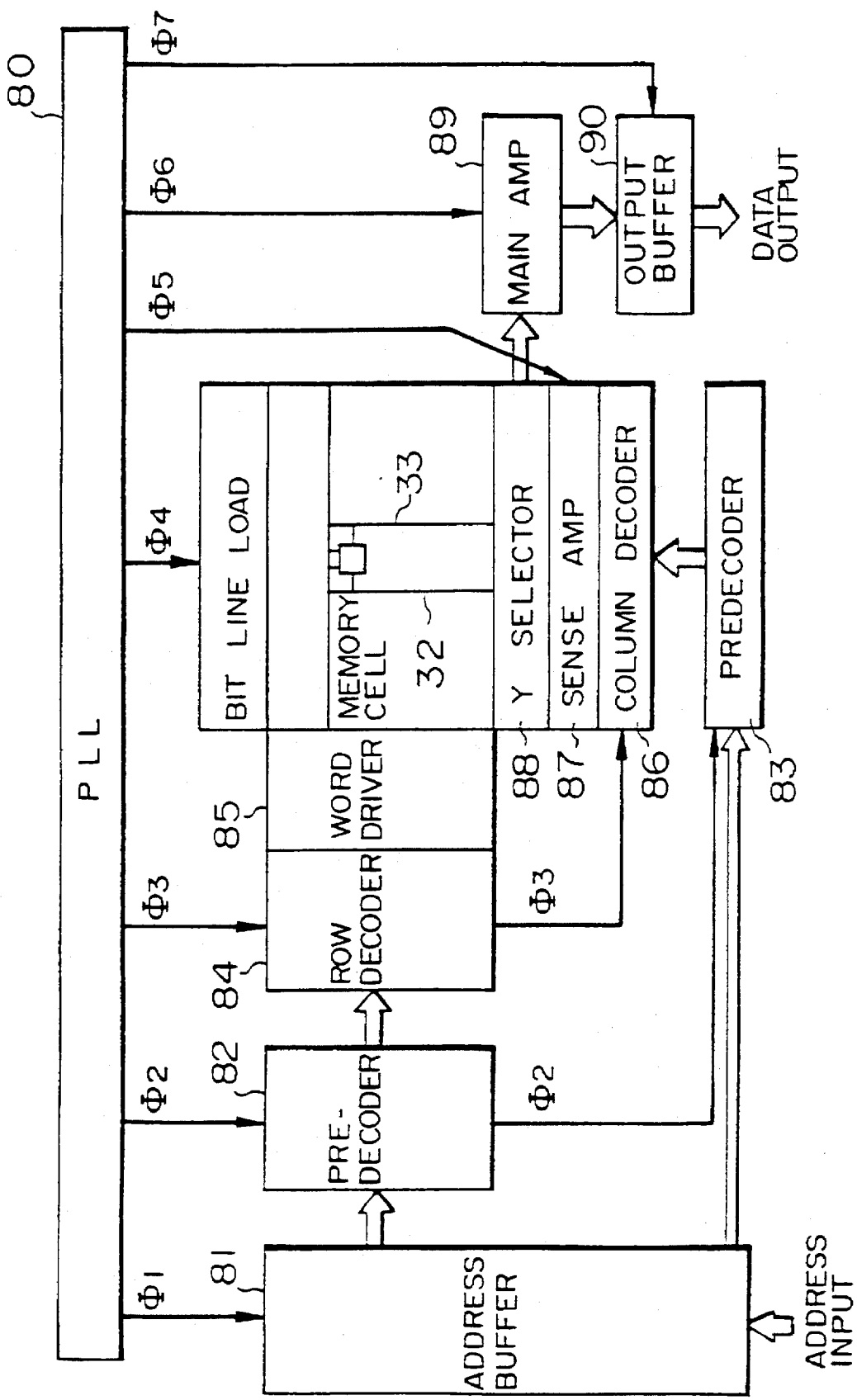
FIG. 8 is a block diagram of still another embodiment of the semiconductor memory device of the invention.

FIG. 8 is a block diagram of a third embodiment 3 of the semiconductor memory device of the invention. This memory device includes a PLL for generating in synchronism with the external clock a plurality of control signal pulses with their phases shifted little by little in turn. The control signal pulses from the PLL are supplied to the internal circuits, making them operate fast. In this case, a suitable arrangement, as illustrated, is constructed for supplying the control signal pulses to the internal circuits.

In FIG. 8, there are shown a PLL 80, an address buffer 81, a row-line predecoder 82, a column-line predecoder 83, a row decoder 84, a word driver 85, a column decoder 86, a sense amplifier 87, a Y selector 88, a main amplifier 89, and an output buffer 90.

As described with reference to the conceptual diagram of FIG. 1, from the PLL 80, the control signal pulse $\Phi_1$ is supplied to the address buffer 81, the control signal pulse $\Phi_2$ to the predecoder 82, the control signal pulse $\Phi_3$ to the row decoder 84 for driving the word driver 85 in the case of FIG. 8, the control signal pulse $\Phi_4$ to the bit lines 32, 33, the control signal pulse $\Phi_5$ to the sense amplifier 87, the control signal pulse $\Phi_6$ to the main amplifier 89, and the control signal pulse $\Phi_7$ to the output buffer 90. These pulses are used for precharging or equalizing.

In this case, it is particularly important that the word line selection timing and the Y selector selection timing be simultaneously performed. As illustrated in the block diagram, the control signal pulse $\Phi_2$ is supplied to both the row-line predecoder 82 for selecting a word and the column-line predecoder 83 for selecting the Y selector 88. Thus, the predecoders 82 and 83 simultaneously generate their output voltages. Similarly, the control signal pulse $\Phi_3$ is supplied both the row decoder 84 and the column decoder 86, and hence they simultaneously generate their output voltages. In other words, the word line and Y selector are selected at a time without being out of timing, and thus erroneous operations are never made.

Figure 9:
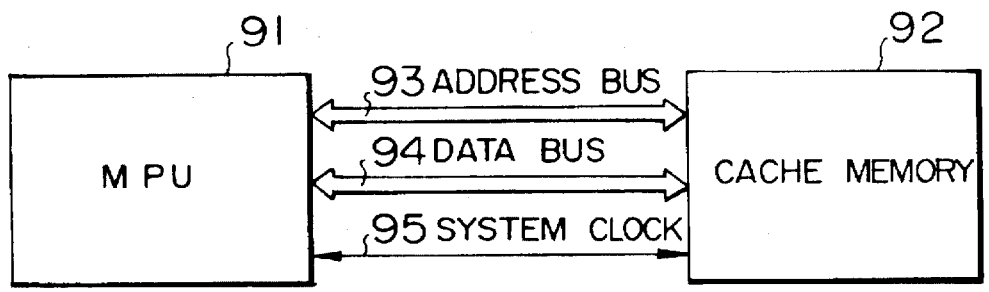
FIG. 9 is a block diagram of a computer system using a semiconductor memory device of the invention.

FIG. 9 is a block diagram of a fourth embodiment of the semiconductor memory device of the invention. This embodiment is a computer system in which the semiconductor memory device of one of the above embodiments of the invention is used as a cache memory. Referring to FIG. 9, there are shown a MPU 91 and a cache memory 92 which are connected by an address bus 93 and a data bus 94. In addition, a system clock 95 is supplied to both the MPU 91 and the cache memory 92. The MPU supplies an address signal through the address bus 93 to the cache memory 92. In the cache memory 92, the address signal from the MPU 91 is supplied to the address buffer as shown in FIGS. 1, 3 and 7. The data corresponding to the address signal is produced from the output buffer of the cache memory 92, and fed through the data bus 94 to the MPU 91. The system clock 95 is supplied to both the MPU 91 and the cache memory 92 as described above. In this case, in the cache memory 92, the system clock is fed to the phase comparator of the PLL circuit as shown in FIGS. 1, 8, 11 and 13, so that internal clock signals are generated therefrom for operating each circuit block within the cache memory 92.

The transmission of signals between the MPU 91 and the cache memory 92 through the address bus 93 and data bus 94 is performed in synchronism with the system clock 95. As shown in the operating waveform diagram of FIG. 10, the address signal $A_0$ is received at a time point $C_0$ of the system clock 95. The data corresponding to the address $A_0$ is represented by $D_0$. This data $D_0$ arrives at the output buffer in a constant time, for example, about two cycles as shown in FIG. 4, without being affected by the dispersion of power supply voltage, temperature and production process conditions. The data $D_0$ can be produced as a data signal at a time point $C_2$ of the system clock 95. Thus, this data signal can be fed through the data bus 94 into the MPU 91.

Figure 2A:
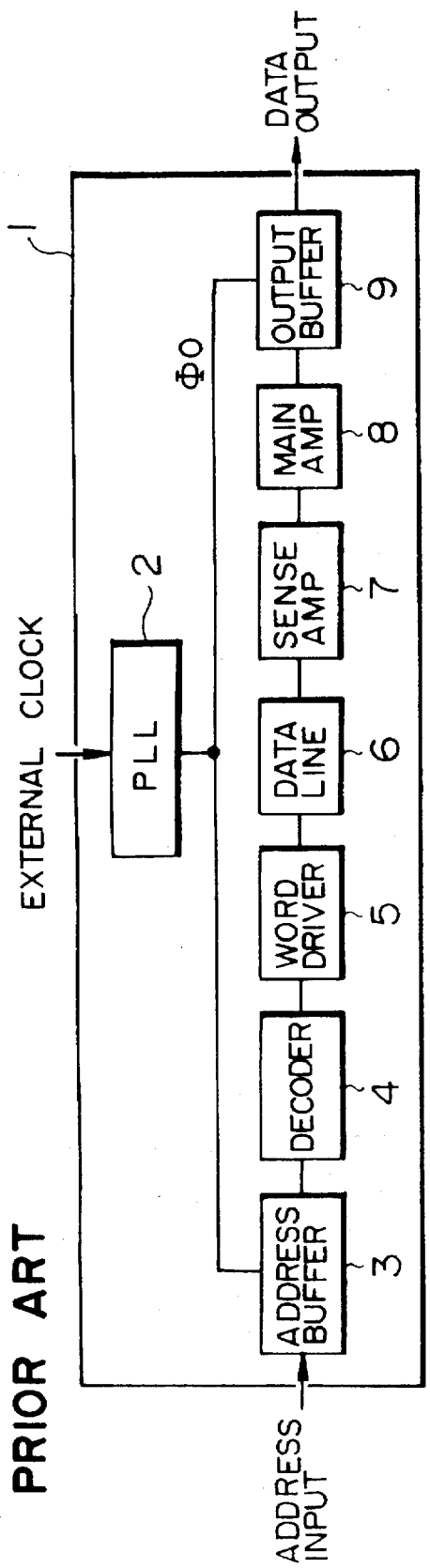
FIGS. 2A and 2B are a conceptual diagram of a chip to which reference is made in explaining the conventional synchronous memory with PLL, and a diagram of signal flow, respectively.
Figure 2B:
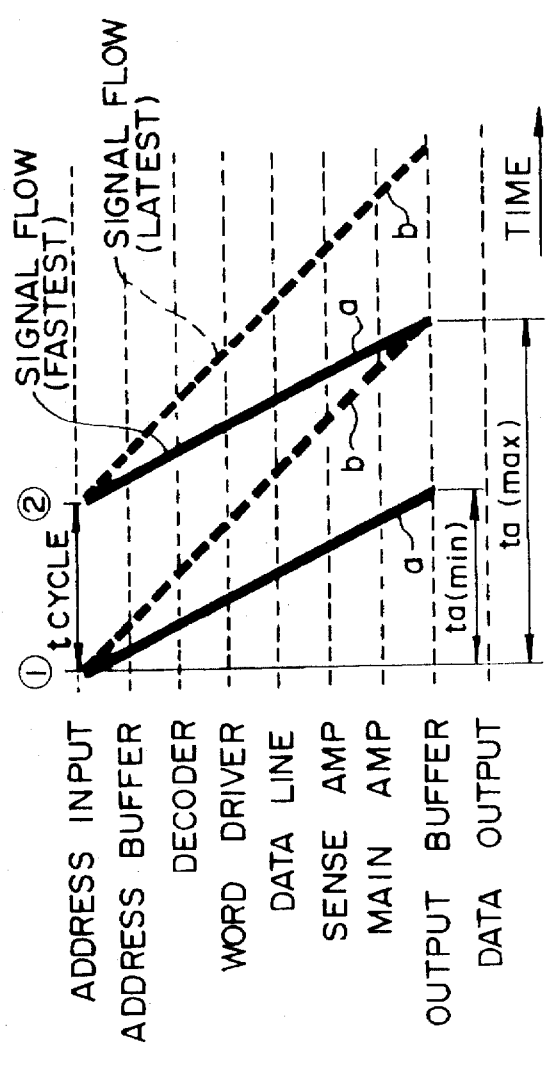
Figure 10:
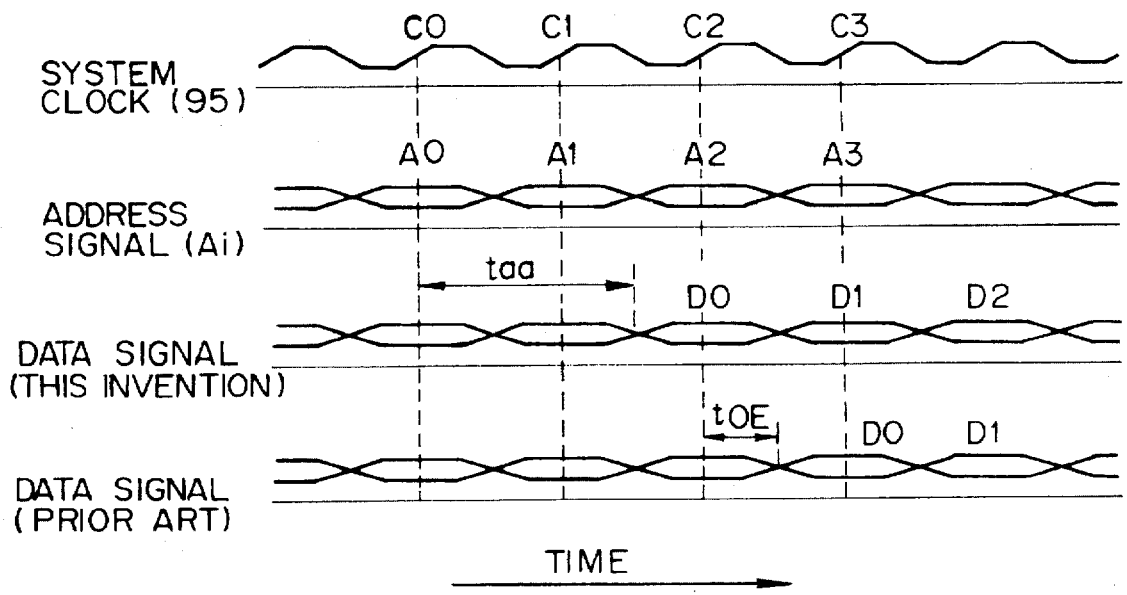
FIG. 10 is an operating waveform diagram showing the data reading operation of the computer system shown in FIG. 9.

In the conventional method shown in FIGS. 2A and 2B, the data signal from the cache memory is affected by the dispersion of power supply voltage, temperature and production process conditions by the time it arrives at the output buffer, and thus it is supposed that it takes a longer time than the time point $C_1$ of the system clock as shown in FIG. 10. Thus, the output command is sent to the output buffer at the time $C_2$ of the system clock, and the data is produced a time $t_{OE}$ after the time point $C_2$. Consequently, in the conventional method, the data is received by the MPU at a time point $C_3$ of the system clock.

In the semiconductor memory device of the invention, the control signal pulses, whose phases are shifted little by little in turn, are generated from the PLL in synchronism with the system clock, and used for signal processing with the result that the data signal is sent, and the sent data signal is produced to the outside under a certain control signal pulse. Therefore, there is no need to issue the output command by clock, and hence the data can be received by the MPU at the time point $C_2$.

Moreover, the semiconductor memory device of the invention can complete the transmission of signals in an extremely short cycle time, as compared with a time corresponding to at least seven cycles taken, as described with respect to the first embodiment, in the conventional synchronous semiconductor memory device without PLL which generates a common internal control signal synchronized with the system clock.

A description will be made of examples of the arrangements of PLL circuits suitable for use in a synchronous memory device of the invention.

As described previously, there are two different PLL circuits: the single oscillator type in which a single oscillator is used for the voltage-controlled oscillator, and the array type in which a plurality of oscillators are connected in an array.

FIGS. 11A and 11B show a PLL circuit of a fifth embodiment of the invention, which uses a single oscillator.

FIG. 11A is a block diagram of the PLL 20. The PLL 20 includes the phase comparator 21 for comparing the phase of the external clock with that of the internal clock signal and producing the error signal, the low-pass filter 22 for integrating the error signal, thereby converting it into an error voltage, and the voltage-controlled oscillator 23 of which the oscillation frequency is controlled by a control voltage proportional to this error voltage. FIG. 11B is a circuit diagram of a specific arrangement of the voltage-controlled oscillator 23. This oscillator 23 includes a plurality of inverters and a plurality of MOS transistors of which the gates are connected together for adjusting the speed of each inverter. This voltage-controlled oscillator 23 generates signal pulses $\Phi_1$ through $\Phi_7$ with their phases shifted little by little in turn, or shifted by an amount corresponding to two inverter stages for each signal pulse. These signal pulses can be used as the control signal pulses to be fed to the circuits shown in FIG. 3.

Figure 12A:
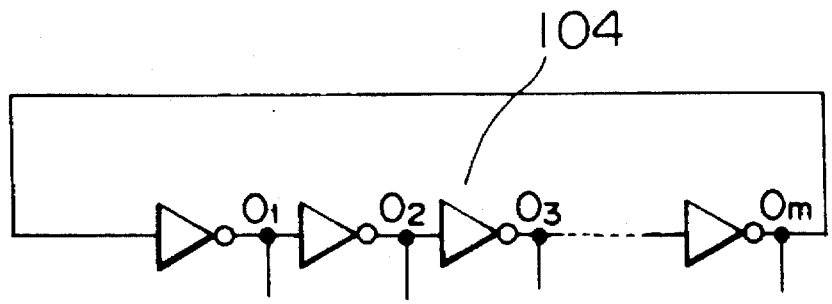
FIGS. 12A and 12B are a circuit diagram of a conventional ring oscillator, and a phase distribution diagram of an output signal at each stage, respectively.
Figure 12B:
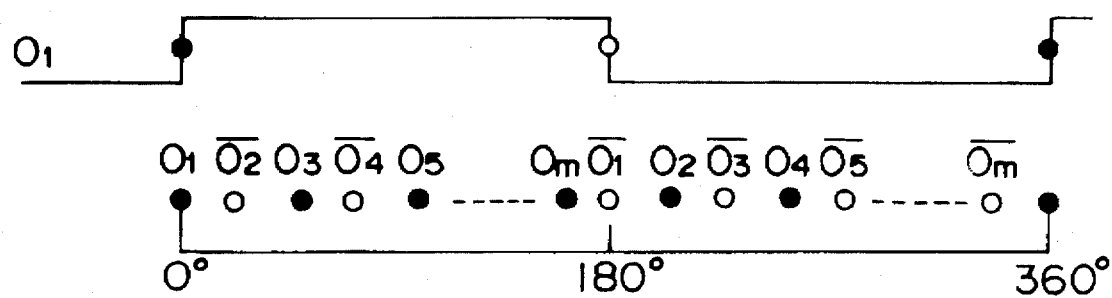

FIGS. 12A and 12B are respectively a conceptional diagram of a m-stage ring oscillator shown in FIG. 11 and a diagram showing the phase of the output signal at each stage. The ring oscillator shown in FIG. 12A has m inverters connected in a ring shape, and it is able to generate clock signals of different phases from the connection points ($O_1$, $O_2$, $O_3$, ..., $O_m$) between the plurality of inverters. In FIG. 12B, the small black circles indicate the leading edges of the clock signal, and the small white circles the trailing edges.

Although the oscillator circuit using this ring oscillator is able to generate the output signal of a different phase from each stage, a large number of inverters are necessary for many signals of different phases, with the result that the oscillation frequency of each signal is reduced. On the contrary, if the number of inverter stages is decreased for high-frequency oscillation, signals of arbitrary phases cannot be obtained.

Figure 13:
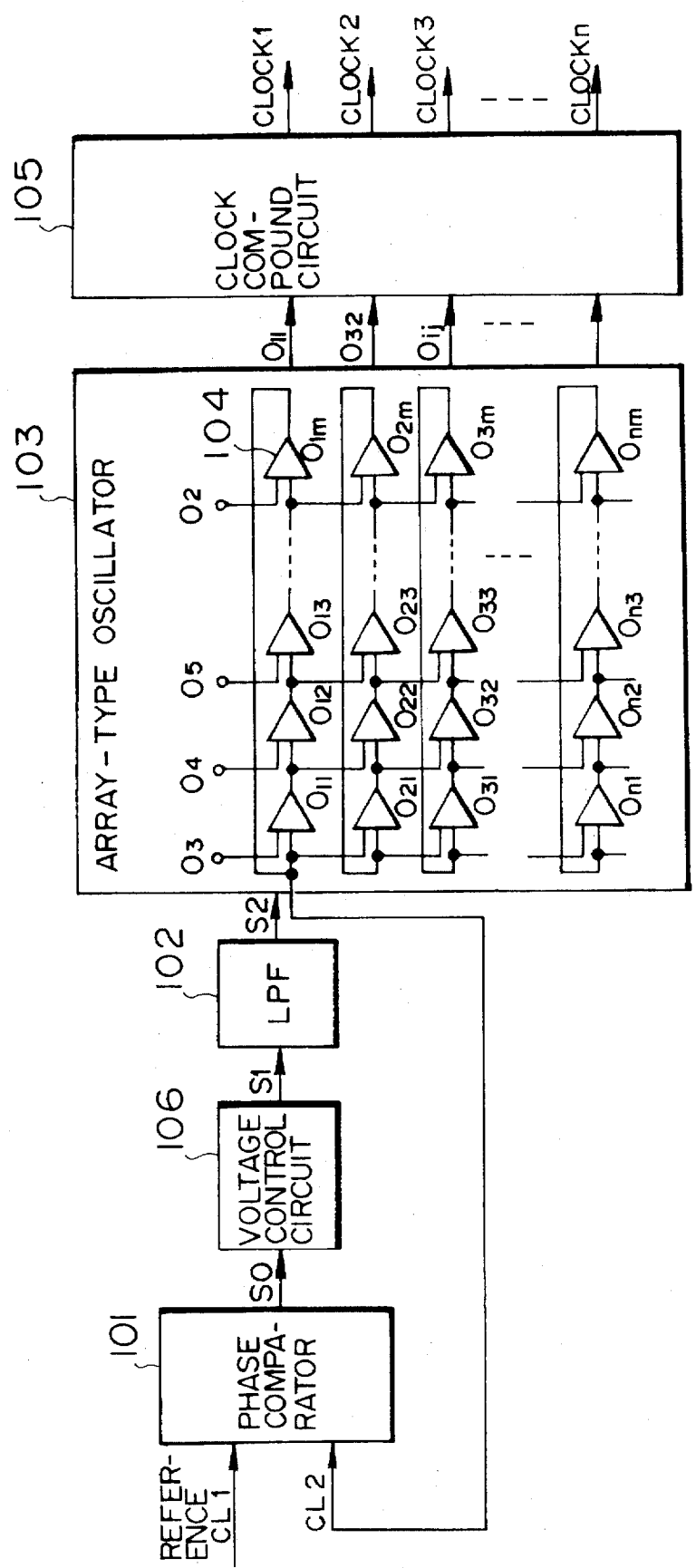
FIG. 13 is a block diagram of a PLL circuit according to another embodiment of the invention.

FIG. 13 is a block diagram of the arrangement of another PLL circuit of the invention, which uses a plurality of oscillators.

In FIG. 13, there are shown a phase comparator 101, a low-pass filter (LPF) 102, an array-type oscillator circuit 103, differential amplifiers 104, a clock signal compound circuit 105, a voltage control circuit 106, an externally-supplied reference clock CL1 an output signal CL2 from the array-type oscillator circuit, an output signal SO from the phase comparator, an output voltage signal S1 from the voltage control circuit, an output voltage signal S2 from the low-pass filter (LPF), complementary signals 011, 012, ..., Oij, ..., Onm from the differential amplifiers of the array-type oscillation circuit, and output signals Clock 1, Clock 2, Clock 3, ... from the clock signal compound circuit.

As shown in FIG. 13, the reference clock CL1 and the clock signal CL2 from the array-type oscillator circuit are supplied to the phase comparator 101. This phase comparator 101 compares the phases of the signals CL1 and CL2 to detect the phase difference, and generates the phase control signal SO in order that the phase of the signal CL2 can be compensated in the array-type oscillator circuit 103. The phase control signal SO is fed to the voltage control circuit 106, and thereby converted into a voltage signal. Thus, the voltage control circuit 106 generates the phase control voltage signal S1. This signal S1 is supplied to the low-pass filter LPF 102, where it is smoothed. The smoothed signal S2 from the low-pass filter 102 is further supplied to the array-type oscillator circuit 103.

The array-type oscillator circuit 103 has buffers (differential amplifiers) two-dimensionally connected in row and column directions. The buffers in each row are connected in a ring shape, and the rows of buffers are also connected in turn in the column direction so that the output signals from the buffers of a row are respectively fed to input ends of those of another row. For example, the buffer (differential amplifier) at the first row, first column is supplied with the output signal O1m from the first-row, m-th-column buffer at the same row, one column before, and with the output signal On3 from the n-th-row, third-column buffer at the last row, two columns after. The buffer O12 at the first row, second column is supplied with the output signal O11 from the first-row, first-column buffer at the same row, one column before, and with the output signal On4 from the n-th-row, fourth-column buffer at the last row, two columns after. In addition, the first-row, third-column buffer, the first-row, fourth-column buffer, ..., are similarly connected in the column direction. Moreover, for example, the second-row, first-column buffer is supplied with the output signal O1m from the first-row, m-th-column buffer at one row before, one column before, and with the output signal O2m from the second-row, m-th-column buffer. The third-row, first-column buffer is supplied with the output signal O2m from the second-row, m-th-column buffer, and with the output signal O3m from the third-row, m-th-column buffer. The fourth-row, first-column buffer, the fifth-row, first-column buffer, ..., are similarly connected in the row direction.

Each buffer (differential amplifier) is also supplied with signal S2 from the LPF 102. The signal S2 acts to change the amount of delay in the differential amplifiers constituting the array-type oscillator circuit, thereby adjusting the phases so that the phase of the signal CL2 can coincide with that of the signal CL1.

The clock signal compound circuit 105 receives the output signals from arbitrary ones of the differential amplifiers of the array-type oscillator circuit and compounds them, thereby generating clock signals of desired phases and pulse widths. Therefore, the previously given external clock (system clock) is used for the reference clock, and the clock signals (Clock 1, Clock 2, ...) produced from the clock signal compound circuit 105 are used as the control signals ($\Phi_1$ through $\Phi_7$) to the circuits shown in FIG. 1 or FIG. 3, thereby making it possible to construct the synchronous memory device of the invention.

Figure 16:
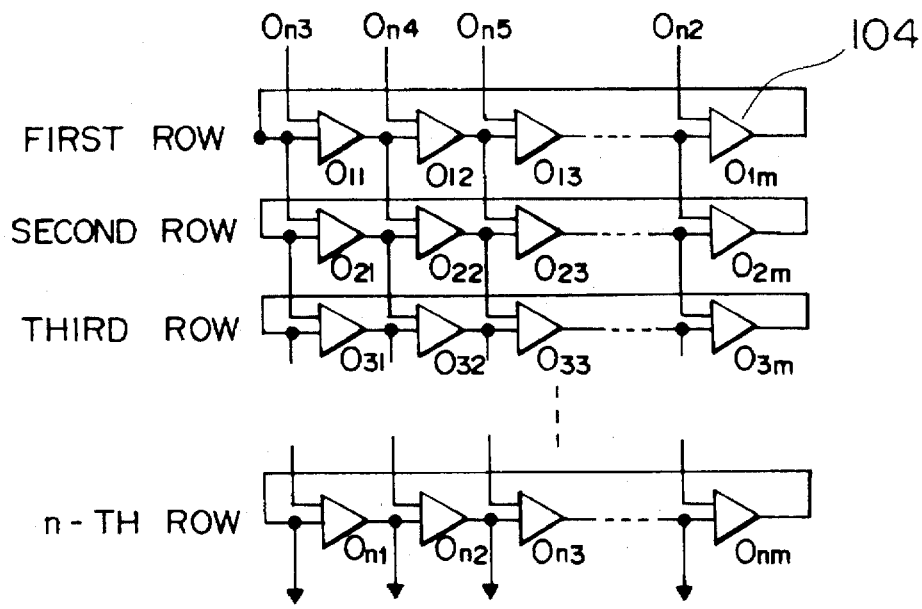
FIG. 16 is a diagram of the arrangement of the array-type oscillator according to an embodiment of the invention.
Figure 17:
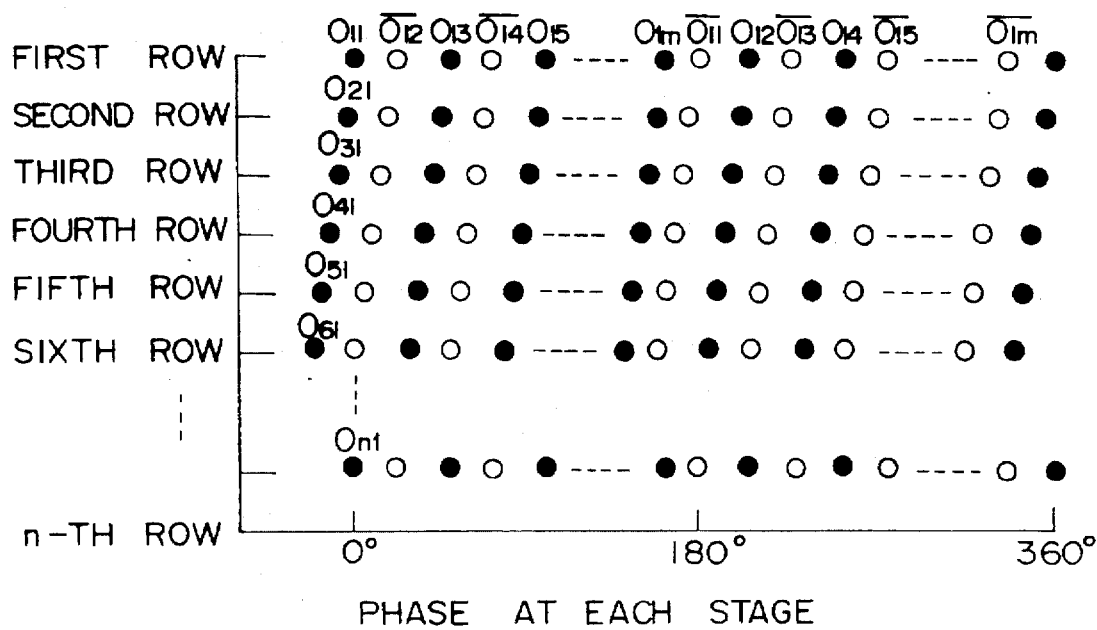
FIG. 17 is a phase distribution diagram of an output signal at each stage of the array-type oscillator shown in FIG. 16.

FIG. 16 shows the arrangement of the array-type oscillator circuit, and FIG. 17 shows the phases of the output signals from the differential amplifiers of the array-type oscillator circuit. In FIG. 17, the small black circles indicate the leading edges of the signals, and the small white circles the trailing edges. The output signals from the oscillators arranged and connected in an array as shown in FIG. 16 have slightly different phases from each other as shown in FIG. 17.

Thus, when the array-type oscillator circuit is used for the oscillator of the PLL circuit, the phases of the output signals are more closely shifted than the conventional ring oscillator, and precise output signals of desired phases can be generated. Thus, by use of the PLL circuit using this array-type oscillator circuit, it is possible to operate each circuit of the synchronous memory device with a minute timing difference, whereby the memory device can operate at high speed. Moreover, since high-precision clock signals are supplied to the circuits, the synchronous memory device can be improved in the reliability of its operation, and it is not necessary to increase the timing margin.

Figure 14:
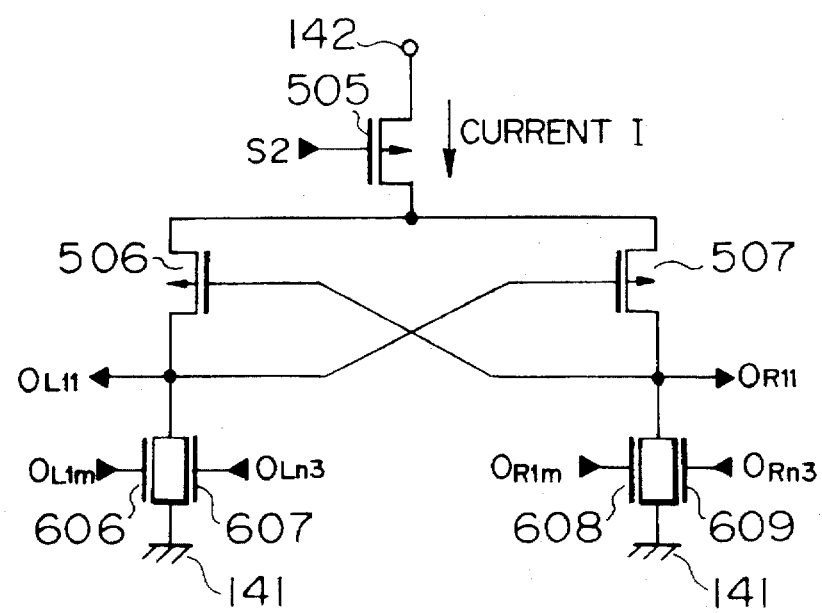
FIG. 14 is a circuit diagram of a differential amplifier used in the array-type oscillator according to the invention.

FIG. 14 is a circuit diagram of one of the differential amplifiers used in the array-type oscillator circuit of the invention. The differential amplifier for use in the array-type oscillator circuit may be a well-known differential amplifier having two transistors which have their source electrodes connected together, and the gate electrodes fed with input signals, and which produce output signals at their drain electrodes. In this case, however, this differential amplifier consumes a lot of power as described above. Particularly in the array-type oscillator circuit in which a large number of differential amplifiers are connected in an array, this power consumption problem is more serious.

In FIG. 14, S2 is the phase control voltage signal. OL1m and OR1m, and OLn3 and ORn3 are two pairs of input complementary signals. For example, OL1m and OR1m are complementary output signals from the first-row, m-th-column differential amplifier shown in FIG. 13. OL11 and OR11 are a pair of output complementary signals. In addition, there are shown pMOSFETs 505, 506, 507, nMOSFETs 606, 607, 608, 609, a first source voltage 141, and a second source voltage 142. In this embodiment, the first source voltage 141 is, for example, ground potential, and the second source voltage is, for example, 5 V, so that the second voltage source 142 is higher than the first voltage source 141. Also, the current I flows in the pMOSFET 505.

In the differential amplifier of the invention, the phase control voltage signal S2 is applied to the gate electrode of the pMOSFET 505. Thus, the voltage of the phase control voltage signal S2 controls the on-resistance and current I of the pMOSFET 505, thereby controlling the delay time in the differential amplifier. Moreover, the output complementary signals OL11, OR11 are produced in accordance with the input complementary signals OL1m, OLn3, OR1m, ORn3 fed to the gates of the nMOSFETs 606, 607, 608, 609. Since this differential amplifier has pMOSFETs 506, 507 cross-coupled for positive feedback amplification, the amplitudes of the input and output signals are equal to the source voltage, and in the steady state either one of the pMOSFETs is turned off. Thus, this differential amplifier circuit causes a steady current not to flow, but causes a current to flow only at the transient of signal. Accordingly, the power consumption of the array-type oscillator circuit can be reduced.

Figure 15:
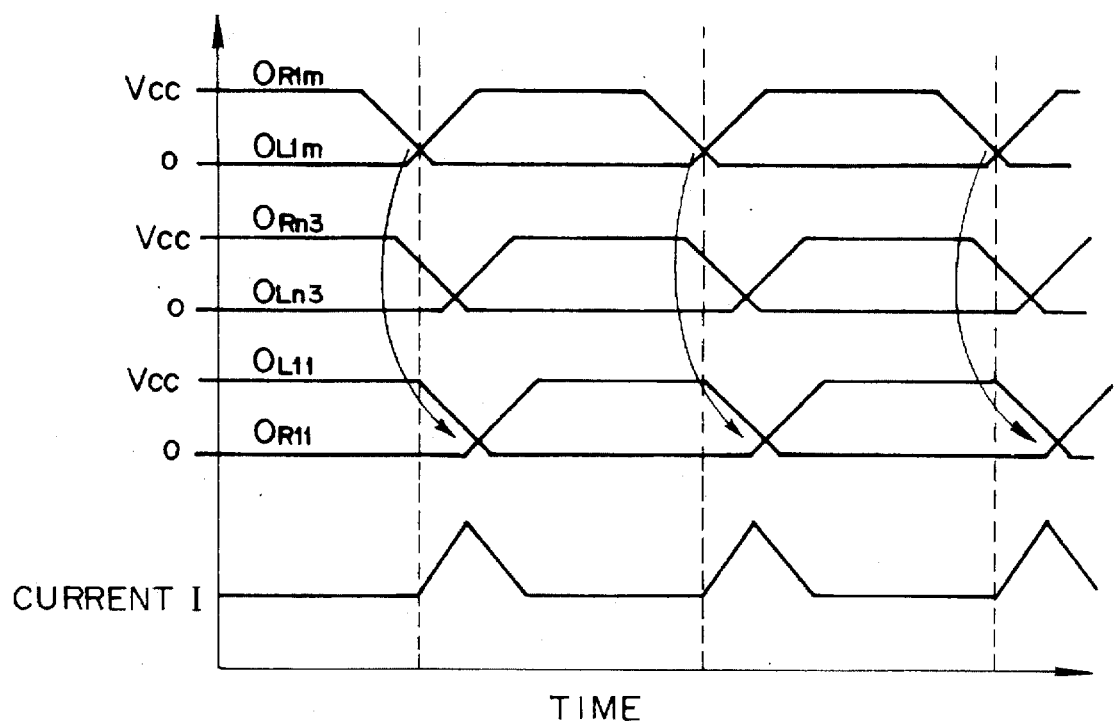
FIG. 15 is a waveform diagram showing the voltage and current operation of the differential amplifier shown in FIG. 2.

FIG. 15 is an operating waveform diagram of voltage and current in the differential amplifier shown in FIG. 14. When either one of the input signals OR1m and ORn3 is changed from high level (for example, 5 V) to low level (for example, ground potential), the nMOSFET 608 or 609 is changed from the on-state to the off-state, and the output signal OR11 is changed from low level to high level. Also, the pMOSFET 506 is changed from the on-state to the off-state. At this time, since the complementary signals to the input signals fed to the nMOSFETs 608, 609 are supplied to the nMOSFETs 606, 607, either one of the nMOSFETs 606, 607 is changed from the off-state to the on-state, so that the output signal OL11 is changed from high level to low level. In this differential amplifier circuit, since each output is positively fed back to the input, switching of the output signals is made in a short time. Also, in the steady state, since either one of the pMOSFET and nMOSFET connected in series is in the off-state, no steady current flows. Only when the output signal of current I is transiently fed back does a current flows. Thus, the power consumption can be greatly reduced. In addition, since the output signals are taken out from the junctions of the pMOSFETs and nMOSFETs connected in series between the second voltage source 142 and the first voltage source 141, the output signals can have large amplitudes. While the pMOSFETs are cross-coupled as shown in FIG. 14, the nMOSFETs and pMOSFETs may be interchanged. Moreover, the MOSFET to which the phase voltage control signal S2 is applied may be provided on the first voltage source side.

Figure 18:
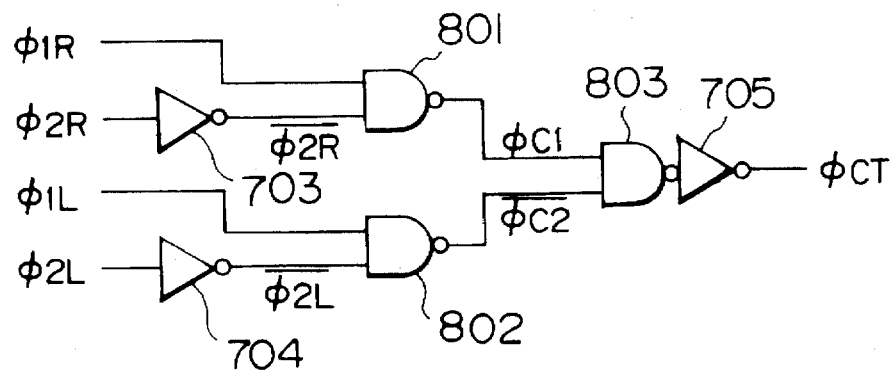
FIG. 18 is a circuit diagram of the clock signal compound circuit according to an embodiment of the invention.
Figure 19:
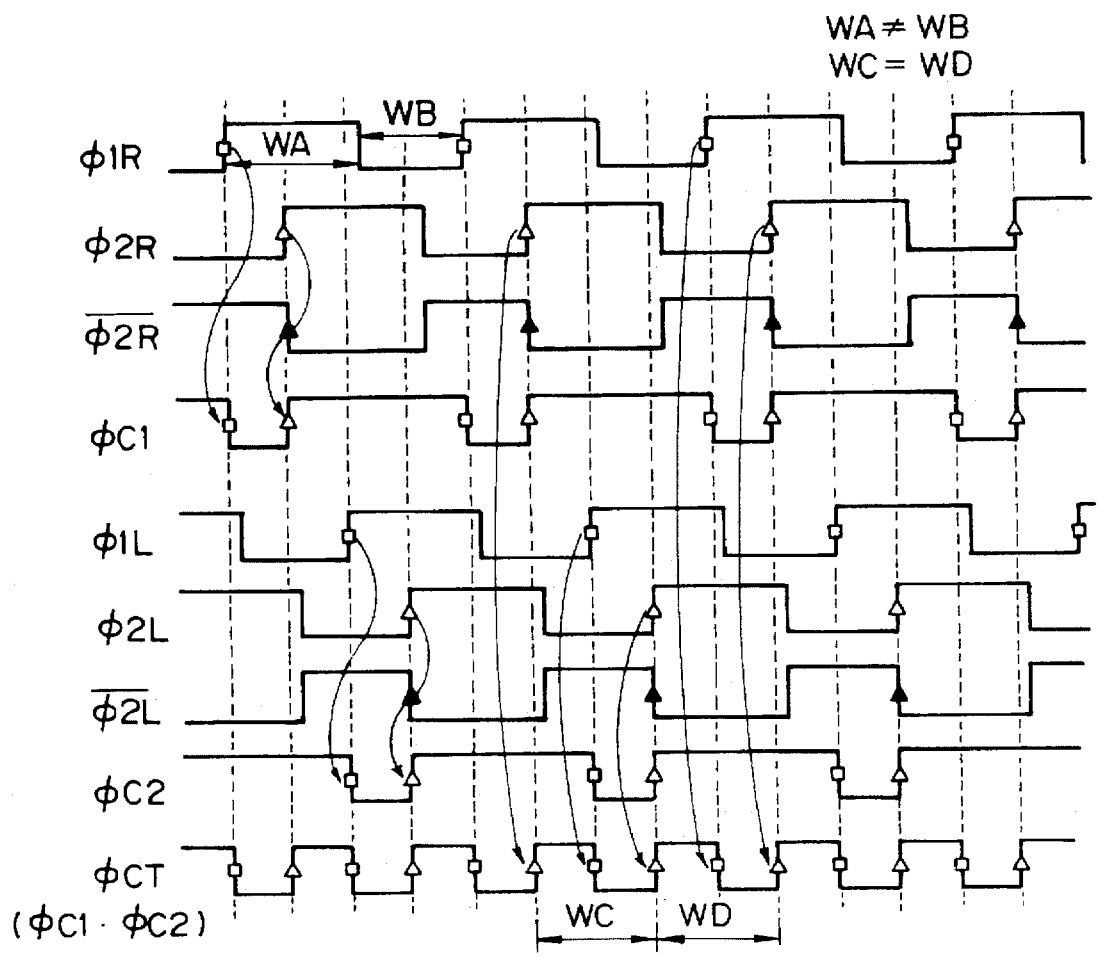
FIG. 19 is an operating voltage waveform diagram of the clock signal compound circuit shown in FIG. 18.

FIG. 18 shows an example of the arrangement of the clock signal compound circuit 105, and FIG. 19 is an operating waveform diagram to which reference is made in explaining the operation of the clock signal compound circuit of FIG. 18. In FIG. 18, there are shown inverters 703, 704, 705, NAND circuits 801, 802, 803, a pair of output complementary signals φ 1R, φ 1L from an arbitrary differential amplifier of the array-type oscillator circuit 103, and a pair of output complementary signals φ 2R, φ 2L from another differential amplifier. In addition, there are shown an inverted signal $\overline{\phi 2R}$ which is produced from the inverter 703 to which the signal φ 2R is fed, and an inverted signal $\overline{\phi 2L}$ which is produced from the inverter 704 to which the signal φ 2L is fed. Also, there are shown an output signal φ C1 which is produced from the NAND circuit 801 to which two signals φ 1R, $\overline{\phi 2R}$ are fed, an output signal φ C2 which is produced from the NAND circuit 802 to which two signals φ 1L, $\overline{\phi 2L}$ are fed, and an output signal φ CT which is produced from the NAND circuit 803 to which two signals φ C1, φ C2 are fed. According to the clock signal compound circuit of the invention, the clock signal is generated on the basis of only the leading edges (or trailing edges) of the signals φ 1R, φ 2R, φ 1L, φ 2L. As, for example, shown in FIG. 19, the clock signal φ C1 of which the timing and pulse width are determined by only the leading edges of the signal φ 1R, and the leading edges of the signal φ 2R can be produced from the NAND circuit 801 which is supplied with the inverted signal $\overline{\phi 2R}$ from the inverter 703 and with the signal φ 1R. Similarly, the timing and pulse width of the clock signal φ C2 are determined by the leading edges of the signal φ 1L and the leading edges of the signal φ 2L. Since the signals φ 1R and φ 1L are a pair of output complementary signals from a differential amplifier, the leading edges (or trailing edges) of those signals always alternately occur at twice the frequency. In addition, the leading edges (or trailing edges) are equally affected by the variations of power supply voltage, process conditions and temperature, and thus occur at equal intervals (WC=WD). Therefore, the composite signal φ CT of the signals φ C1, φ C2 is a clock signal which occurs at twice the frequency with almost no effect of the variations of power supply voltage, process conditions and temperature.

While this invention can be suitably applied particularly to a semiconductor memory device having static-type memory cells with a feature of fast operation capability as described in the preferred embodiments of the invention, the present invention may be applied to other different semiconductor memory devices such as ones having dynamic memory cells, and ROMs. Also, other various design changes and modifications can be naturally made without departing from the scope of the invention.

Moreover, while the array-type oscillator circuits of the invention mentioned above are suited to be used in the synchronous memory, they may be used in the semiconductor integrated circuits which need the clock signals of a high frequency and arbitrary phases, such as a microcomputer and digital signal processor.

Thus, according to the semiconductor memory device of the invention, as described in the above embodiments, the PLL or DLL which generates control signal pulses with their phases shifted little by little in turn in synchronism with the external clock is provided in the memory device, and the control signal pulses from the PLL or DLL are supplied to the internal circuits along the signal flow of address input to data output, thereby precharging or equalizing them before the internal circuits make signal processing. Therefore, the signal processing can be made in a constant time without being affected by the variations of power supply voltage, temperature and production process conditions. Consequently, the operating cycle time can be made shorter than the access time, and the access time can be kept constant, so that data can be read out in a shorter cycle time than in the prior art.

According to this invention mentioned above, since the array-type oscillator circuit can be operated at low and can generate precise clock signals of desired phases with almost no effect of the variations of power supply voltage, process conditions and temperature, the synchronous memory using this array-type oscillator circuit can thus be operated at high speed and low power.

What is claimed is:

1. In a semiconductor memory device of synchronous type having an address buffer for latching an address signal, a decoder for decoding said address signal from said address buffer, a word driver for amplifying the output from said decoder and thereby driving a word line, a data line for use in taking out a signal from a memory cell selected by said word line, a sense amplifier for detecting said signal on said data line, a main amplifier for amplifying said signal detected by said sense amplifier, an output buffer for supplying said signal amplified by said main amplifier to the outside as data, and a control circuit, whereby an address input and a data signal output are synchronous with an external clock signal input to said control circuit, the improvement wherein said control circuit comprises:

a control signal generator for generating a plurality of control signals of different phases in synchronism with said external clock signal, said plurality of control signals of different phases being respectively supplied to at least said address buffer, said decoder, said data line, said sense amplifier, said main amplifier, and said output buffer, thereby precharging said address buffer and said decoder, and equalizing said data line, said sense amplifier, said main amplifier and said output buffer, during a predetermined time for each control signal, wherein after said predetermined time for each control signal, said output buffer outputs data corresponding to the address signal input to said address buffer in response to said control signal respectively supplied thereto.

2. A semiconductor memory device according to claim 1, wherein said decoder includes a row-line decoder and a column-line decoder, and each of said control signals generated from said control signal generator is supplied to both said row-line decoder and said column-line decoder.

3. A semiconductor memory device according to claim 1, wherein said control signal generator is a phase-locked loop.

4. A semiconductor memory device according to claim 1, wherein said control signal generator is a delay-locked loop.

5. A semiconductor memory device according to claim 2, wherein said decoder includes a first MOS, the gate electrode of which is supplied with a precharging signal; a second MOS transistor, the drain electrode of which is connected to the source electrode of said first MOS transistor; and a third MOS transistor, the drain electrode of which is connected to the source electrode of said second MOS transistor;

wherein said first, second, and third MOS transistors are all of the same conductivity type; and wherein said precharging signal acts to precharge the source electrode of said first MOS transistor, such that decoding is made by said address signal being fed to the gate electrodes of said second and third MOS transistors.

6. A computer system comprising said semiconductor memory device according to claim 1 and a microprocessor which are connected by an address bus and a data bus, and which are both supplied with a common system clock so that data can be supplied from said semiconductor memory device to said microprocessor.

7. A semiconductor memory device comprising:

a plurality of word lines;

a plurality of data lines;

a plurality of memory cells provided at intersections of said word lines and said data lines;

an address buffer for receiving an address signal and producing an internal address signal;

a decoder for decoding said internal address signal from said address buffer into a decoded signal for use in selecting one of said memory cells which corresponds to said address signal;

a word driver for receiving said decoded signal and selectively driving said word lines;

an amplifier for amplifying a signal produced on the corresponding data line;

an output buffer for supplying an output signal from said amplifier to the outside; and a PLL circuit for generating a plurality of internal clock signals of different phases on the basis of a reference clock fed from the outside, wherein said internal clock signals from said PLL are respectively fed to said address buffer, said decoder, said amplifier, and said output buffer.

8. A semiconductor memory device according to claim 7, wherein said address buffer produces said internal address signal in synchronism with a first one of said internal clock signals.

9. A semiconductor memory device according to claim 8, wherein said decoder produces said decoder signal by decoding said internal address signal in synchronism with a second one of said internal clock signals, said second internal clock signal being delayed in phase relative to said first internal clock signal.

10. A semiconductor memory device according to claim 9, wherein said amplifier amplifies said signal in synchronism with a third one of said internal clock signals, said third internal clock signal being delayed in phase relative to said second internal clock signal.

11. A semiconductor memory device according to claim 10, wherein said output buffer supplies said amplified signal from said amplifier to the outside in synchronism with a fourth one of said internal clock signals, said fourth internal clock signal being delayed in phase relative to said third internal clock signal.

12. A semiconductor memory device according to claim 7, wherein said PLL circuit comprises a phase comparator, a low-pass filter and an oscillator, said phase comparator being used to compare the phase of said reference clock with the phase of the output from said oscillator, said low-pass filter being used to receive the output from said phase comparator and produce a control voltage for controlling the oscillation frequency of said oscillator, and said oscillator being used to produce an output signal having a frequency determined according to said control voltage.

13. A semiconductor memory device according to claim 12, wherein said oscillator of said PLL circuit is a ring oscillator which has a plurality of inverters connected in series, and said inverters are adjusted in their speeds by said control voltage and supply their outputs as said internal clock signals to said address buffer, said decoder, said amplifier, and said output buffer.

14. A semiconductor memory device according to claim 12, wherein said oscillator of said PLL circuit has a plurality of differential amplifiers connected in an array, and said differential amplifiers are adjusted in their operating speeds by said control voltage and supply their outputs as internal clock signals to said address buffer, said decoder, said amplifier, and said output buffer.

15. A semiconductor memory device according to claim 14, wherein each of said differential amplifiers of said oscillator has two pairs of differential input terminals, a load of two transistors having cross-coupled gate electrodes and drain electrodes, and a current source connected to the source electrodes of said two transistors, the current from said current source being controlled by said control voltage.

* * * * *

UNITED STATES PATENT AND TRADEMARK OFFICE
CERTIFICATE OF CORRECTION

PATENT NO. : 5,740,115
DATED : April 14, 1998
INVENTOR(S) : K. ISHIBASHI et al

It is certified that error appears in the above-indentified patent and that said Letters Patent is hereby corrected as shown below:

Column, 17, claim 1, line 31, change "for latching" to --which latches--;
    line 32, change "for decoding" to --which decodes--;
    line 33, change "for amplifying" to --which amplifies--;
    line 36, change "for detecting" to --which detects--;
    line 37, change "for amplifying" to --which amplifies--;
    line 38, change "for sup-" to --which supplies--;
    line 39, delete "plying"; and
    line 44, change "for generating" to --which generates--.

Column 18, claim 5, line 2, after "MOS" insert --transistor--.

Column 18, claim 7, line 28, change "for receiving" to --that receives--;
    line 29, change "producing" to --produces--;
    line 30, change "for decoding" to --that decodes--;
    line 34, change "for receiving" to --that receives--;
    line 35, change "driving" to --drives--;
    line 36, change "for amplifying" to --that amplifies--;
    line 39, change "for supplying" to --that supplies--; and
    line 41, change "for generating" to --which generates--.

Column 18, claim 9, line 52, change "decoder" to --decoded--.

UNITED STATES PATENT AND TRADEMARK OFFICE
CERTIFICATE OF CORRECTION

PATENT NO. : 5,740,115
DATED : April 14, 1998
INVENTOR(S) : K. ISHIBASHI et al

It is certified that error appears in the above-indentified patent and that said Letters Patent is hereby corrected as shown below:

Column 19, claim 12, line 7, change "for controlling" to --to control--.

Signed and Sealed this

Fourth Day of August, 1998

Attest:

BRUCE LEHMAN

*Attesting Officer*   *Commissioner of Patents and Trademarks*